United States Patent
Ning et al.

(10) Patent No.: US 10,453,893 B2
(45) Date of Patent: Oct. 22, 2019

(54) METHODS OF PROVIDING SEMICONDUCTOR DEVICES AND SEMICONDUCTOR DEVICES THEREOF

(71) Applicant: Arizona Board of Regents on behalf of Arizona State University, Scottsdale, AZ (US)

(72) Inventors: Cun-Zheng Ning, Chandler, AZ (US); Sunay Turkdogan, Tempe, AZ (US); Zhicheng Liu, Tempe, AZ (US); Fan Fan, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 15/829,551

(22) Filed: Dec. 1, 2017

(65) Prior Publication Data
US 2018/0083064 A1   Mar. 22, 2018

Related U.S. Application Data

(63) Continuation of application No. PCT/US2016/035550, filed on Jun. 2, 2016.
(Continued)

(51) Int. Cl.
*H01L 27/15* (2006.01)
*H01L 21/02* (2006.01)
(Continued)

(52) U.S. Cl.
CPC .......... *H01L 27/15* (2013.01); *H01L 21/0256* (2013.01); *H01L 21/0262* (2013.01);
(Continued)

(58) Field of Classification Search
CPC ............. H01L 27/153; H01L 21/02557; H01L 21/0256; H01L 21/04; H01L 21/225;
(Continued)

(56) References Cited

U.S. PATENT DOCUMENTS 5,989,372 A * 11/1999 Momoda ............. H01L 21/4803
156/273.1
9,267,076 B2   2/2016 Ning et al.
(Continued)

FOREIGN PATENT DOCUMENTS

JP   2007227679 A   9/2007
JP   2013118173 A   6/2013
(Continued)

OTHER PUBLICATIONS

Pan, A. et al., "Continuous Alloy-Composition Spatial Grading and Superbroad Wavelength-Tunable Nanowire Lasers on a Single Chip", Nano Letters, Jan. 2009, vol. 9, No. 2, pp. 784-788 <DOI:10.1021/nl803456k>.
(Continued)

*Primary Examiner* — Thanh T Nguyen
(74) *Attorney, Agent, or Firm* — Bryan Cave Leighton Paisner LLP

(57) ABSTRACT

Some embodiments include a method. The method can include: providing a carrier substrate; forming a first device material over the carrier substrate; and after forming the first device material over the carrier substrate, transforming the first device material into a second device material. Meanwhile, the transforming the first device material into the second device material can include: causing a cationic exchange in the first device material; and causing an anionic exchange in the first device material. The causing the cationic exchange in the first device material and the causing the anionic exchange in the first device material can occur (Continued)

approximately simultaneously. Other embodiments of related methods and systems are also disclosed.

19 Claims, 9 Drawing Sheets

Related U.S. Application Data

(60) Provisional application No. 62/169,753, filed on Jun. 2, 2015.

(51) Int. Cl.
| | | |
|---|---|---|
| *H01L 21/04* | (2006.01) | |
| *H01L 21/225* | (2006.01) | |
| *H01L 21/265* | (2006.01) | |
| *H01L 33/00* | (2010.01) | |
| *H01L 33/28* | (2010.01) | |
| *H01S 5/30* | (2006.01) | |
| *H01S 5/40* | (2006.01) | |

(52) U.S. Cl.
CPC .. *H01L 21/02557* (2013.01); *H01L 21/02664* (2013.01); *H01L 21/04* (2013.01); *H01L 21/225* (2013.01); *H01L 21/265* (2013.01); *H01L 27/153* (2013.01); *H01L 33/0087* (2013.01); *H01L 33/0095* (2013.01); *H01L 33/28* (2013.01); *H01S 5/3018* (2013.01); *H01S 5/4093* (2013.01); *H01L 21/02568* (2013.01); *H01L 33/005* (2013.01)

(58) Field of Classification Search
CPC ... H01L 21/265; H01L 33/28; H01L 33/0095; H01L 33/0087; H01L 27/15; H01L 21/02664; H01L 21/0262; H01L 21/02568; H01L 33/005; H01L 33/00; H01L 21/02; H01S 5/4093; H01S 5/3018; H01S 5/30; H01S 5/40
See application file for complete search history.

(56) References Cited

U.S. PATENT DOCUMENTS

| | | | |
|---|---|---|---|
| 9,589,793 | B2 | 3/2017 | Ning et al. |
| 10,023,795 | B2 | 7/2018 | Ning |
| 2008/0067924 | A1 | 3/2008 | Prakash et al. |
| 2012/0112215 | A1 | 5/2012 | Chai et al. |
| 2012/0223418 | A1* | 9/2012 | Stowers .............. C23C 18/06 257/632 |
| 2012/0318324 | A1 | 12/2012 | Ning et al. |
| 2013/0215513 | A1* | 8/2013 | Liang .................. G02B 1/11 359/601 |
| 2019/0172966 | A1 | 6/2019 | Chin et al. |

FOREIGN PATENT DOCUMENTS

| | | |
|---|---|---|
| WO | 2010054231 A1 | 5/2010 |
| WO | 2013184203 A2 | 12/2013 |
| WO | 2018035261 A1 | 2/2018 |

OTHER PUBLICATIONS

Pan, A. et al., "Fabrication and Red-Color Lasing of Individual Highly Uniform Single-Crystal CdSe Nanobelts", Journal of Physical Chemistry C, Aug. 2007, vol. 111, No. 38, pp. 14253-14256 <DOI:10.1021/jp0740548>.
Pan, A. et al., "Quaternary Alloy Semiconductor Nanobelts with Bandgap Spanning the Entire Visible Spectrum", Journal of the American Chemical Society, Jun. 2009, vol. 131, No. 27, pp. 9502-9503 <DOI:10.1021/ja904137m>.
Pan, A. et al., "Spatial Composition Grading of Quaternary ZnCdSSe Alloy Nanowires with Tunable Light Emission between 350 and 710 nm on a Single Substrate", ACS Nano, Jan. 2010, vol. 4, No. 2, pp. 671-680 <DOI:10.1021/nn901699h>.
Pan, A. et al., "Stimulated Emissions in Aligned CdS Nanowires at Room Temperature", The Journal of Physical Chemistry B, Dec. 2005, vol. 109, No. 51, pp. 24268-24272 <DOI:10.1021/jp055164m>.
Pascu, M. et al., "Tunable dye laser applications in environment pollution monitoring", Journal of Molecular Structure, Oct. 2001, vol. 598, No. 1, pp. 57-64 <DOI:10.1016/S0022-2860(01)00805-5>.
Patent Cooperation Treaty, International Searching Authority, International Preliminary Report on Patentability for PCT/US2016/035550, 7 pages, report issued Dec. 5, 2017, opinion dated Mar. 13, 2017.
Patent Cooperation Treaty, International Searching Authority, International Search Report for PCT/US2016/035550, 3 pages, dated Mar. 13, 2017.
Qian, F. et al., "Multi-quantum-well nanowire heterostructures for wavelength-controlled lasers", Nature Materials, Sep. 2008 (available online Aug. 2008), vol. 7, pp. 701-706 <DOI:10.1038/nmat2253>.
Röder, R. et al., "Polarization features of optically pumped CdS nanowire lasers", Journal of Physics D: Applied Physics, Sep. 2014, vol. 47, article 394012, 6 pages <DOI:10.1088/0022-3727/47/39/394012>.
Son, D. et al., "Cation Exchange Reactions in Ionic Nanocrystals", Science, Nov. 2004, vol. 306, No. 5698, pp. 1009-1012 <DOI:10.1126/science.1103755>.
Tang, S. et al., "A multi-color fast-switching microfluidic droplet dye laser", Lab on a Chip, Aug. 2009, vol. 9, pp. 2767-2771 <DOI:10.1039/B914066B>.
Teledyne Lumenera., "Infinity 2-1R Camera Datasheet", Lumenera Microscopy USB 2.0 Cameras, 2017, 2 pages, retrieved from the internet: <URL:https://www.lumenera.com/media/wysiwyg/resources/documents/datasheets/microscopy/infinity-2-1R-datasheet.pdf>.
Tong, L. et al., "Assembly of Silica Nanowires on Silica Aerogels for Microphotonic Devices", Nano Letters, Jan. 2005, vol. 5, No. 2, pp. 259-262 <DOI:10.1021/nl0481977>.
Vijayalakshmi, R. et al., "Structural and bandgap studies of ZnSxCdSe1-x thin films", Semiconductor Science and Technology, Jan. 1994, vol. 9, No. 5, pp. 1062-1068 <DOI:10.1088/0268-1242/9/5/010>.
Wang, M. et al., "Synthesis of Tapered CdS Nanobelts and CdSe Nanowires with Good Optical Property by Hydrogen-Assisted Thermal Evaporation", Nanoscale Research Letters, Jul. 2009, vol. 4, pp. 1166-1170 <DOI:10.1007/s11671-009-9376-9>.
Wang, Y. et al., "Gas-phase anion exchange towards ZnO/ZnSe heterostructures with intensive visible light emission", Journal of Materials Chemistry C, Feb. 2014, vol. 2, No. 15, pp. 2793-2798 <DOI:10.1039/C3TC32312A>.
Wang, Z. et al., "Manipulation of the Morphology of CdSe Nanostructures: The Effect of Si", Advanced Functional Materials, Mar. 2006 (available online Feb. 2006), vol. 16, No. 5, pp. 661-666 <DOI:10.1002/adfm.200500646>.
Wierer, J. et al., "Comparison between blue lasers and light-emitting diodes for future solid-state lighting", Laser & Photonics Reviews, Nov. 2013 (available online Aug. 2013), vol. 7, No. 6, pp. 963-993 <DOI:10.1002/lpor.201300048>.
Xu, J. et al., "Room-Temperature Dual-Wavelength Lasing from Single-Nanoribbon Lateral Heterostructures", Journal of the American Chemical Society, Jul. 2012, vol. 134, No. 30, pp. 12395-12397 <DOI:10.1021/ja3050458>.
Xu, Z. et al., "Large laser projection displays utilizing all-solid-state RGB lasers", Light-Emitting Diode Materials and Devices, Photonics Asia (Beijing, China, 2004), Proceedings vol. 5632, 8 pages.
Yamaguchi, T. et al., "Microdefects and minority carrier diffusion lengths in II-VI wide-gap semiconductors", Electronics and Communications in Japan (Part II: Electronics), Jan. 1998, vol. 81, No. 10, pp. 33-41 <DOI:10.1002/(SICI)1520-6432(199810)81:10<55::AID-ECJB7>3.0.CO;2-7>.

(56) References Cited

OTHER PUBLICATIONS

Yamashita, K. et al., "Simultaneous RGB lasing from a single-chip polymer device", Optics Letters, Jul. 2010, vol. 35, No. 14, pp. 2451-2453 <DOI:10.1364/OL.35.002451>.

Yang, Z. et al., "On-Nanowire Spatial Band Gap Design for White Light Emission", Nano Letters, Oct. 2011, vol. 11, No. 11, pp. 5085-5089 <DOI:10.1021/nl203529h>.

Yue, G. et al., "Synthesis of two-dimensional micron-sized single-crystalline ZnS thin nanosheets and their photoluminescence properties", Journal of Crystal Growth, Aug. 2006 (available online Jul. 2006), vol. 293, No. 2, pp. 428-432 <DOI:10.1016/j.crysgro.2006.05.053>.

Zhang, X. et al., "Polarity Determination for the CdxZn1-xS Nanocombs by EELS", Journal of Electron Microscopy, Jan. 2008 (available online Dec. 2007), vol. 57, No. 1, pp. 7-11 <DOI:10.1093/jmicro/dfm035>.

Zhao, J. et al., "Recording and reconstruction of a color holographic image by using digital lensless Fourier transform holography", Optics Express, Feb. 2008, vol. 16, No. 4, pp. 2514-2519 <DOI:10.1364/OE.16.002514>.

Zimmler, M. et al., "Laser action in nanowires: Observation of the transition from amplified spontaneous emission to laser oscillation", Applied Physics Letters, Aug. 2008, vol. 93, article 051101, 3 pages <DOI:10.1063/1.2965797>.

Zimmler, M. et al., "Optically pumped nanowire lasers: invited review", Semiconductor Science and Technology, Jan. 2010, vol. 25, No. 2, article 024001, 12 pages <DOI:10.1088/0268-1242/25/2/024001>.

Agarwal, R. et al., "Lasing in Single Cadmium Sulfide Nanowire Optical Cavities", Nano Letters, Mar. 2005, vol. 5, No. 5, pp. 917-920 <DOI:10.1021/nl050440u>.

Alivisatos, A., "Semiconductor Clusters, Nanocrystals, and Quantum Dots", Science, Feb. 1996, vol. 271, No. 5251, pp. 933-937 <DOI:10.1126/science.271.5251.933>.

Anikeeva, P. et al., "Quantum Dot Light-Emitting Devices with Electroluminescence Tunable over the Entire Visible Spectrum", Nano Letters, Jun. 2009, vol. 9, No. 7, pp. 2532-2536 <DOI:10.1021/nl9002969>.

Casperson, L., "Threshold characteristics of multimode laser oscillators", Journal of Applied Physics, Dec. 1975 (available online Sep. 2008), vol. 46, No. 12, pp. 5194-5201 <DOI:10.1063/1.321311>.

Chellappan, K. et al., "Laser-based displays: a review", Applied Optics, Sep. 2010 (available online Aug. 2010), vol. 49, No. 25, pp. F79-F98 <DOI:10.1364/AO.49.000F79>.

Chen, S. et al., "White light emission with red-green-blue lasing action in a disordered system of nanoparticles", Applied Physics Letters, Sep. 2012, vol. 101, article 123508, 5 pages <DOI:10.1063/1.4754286>.

Choi, Y.-J. et al., "Morphological evolution of CdS nanowires to nanosheets", Journal of Nanoscience and Nanotechnology, Jul. 2009, vol. 9, No. 7, pp. 4487-4491 <DOI:10.1166/jnn.2009.M81>.

Cossu, G. et al., "3.4 Gbit/s visible optical wireless transmission based on RGB LED", Optics Express, Dec. 2012, vol. 20, No. 26, pp. B501-B506 <DOI:10.1364/OE.20.00B501>.

Dang, C. et al., "Red, green and blue lasing enabled by single-exciton gain in colloidal quantum dot films", Nature Nanotechnology, May 2012 (available online Apr. 2012), vol. 7, pp. 335-339 <DOI:10.1038/nnano.2012.61>.

Deng, Z. et al., "Band Gap Engineering of Quaternary-Alloyed ZnCdSSe Quantum Dots via a Facile Phosphine-Free Colloidal Method", Journal of the American Chemical Society, Nov. 2009, vol. 131, No. 49, pp. 17744-17745 <DOI:10.1021/ja908408m>.

Denton, A. et al., "Vegard's law", Physical Review A, Mar. 1991, vol. 43, No. 6, pp. 3161-3164 <DOI:10.1103/PhysRevA.43.3161>.

Ding, J. et al., "Lasing in ZnS nanowires grown on anodic aluminum oxide templates", Applied Physics Letters, Sep. 2004, vol. 85, No. 12, pp. 2361-2363 <DOI:10.1063/1.1791326>.

Ding, Y. et al., "Nanowires/microfiber hybrid structure multicolor laser", Optics Express, Nov. 2009, vol. 17, No. 24, pp. 21813-21818 <DOI:10.1364/OE.17.021813>.

Dloczik, L. et al., "Nanostructure Transfer in Semiconductors by Ion Exchange", Nano Letters, Apr. 2003, vol. 3, No. 5, pp. 651-653 <DOI:10.1021/nl0340879>.

Fan, F. et al., "A monolithic white laser", Nature Nanotechnology, Jul. 2015, vol. 10, pp. 796-803, supp 32 p. <DOI:10.1038/nnano.2015.149>.

Fan, F. et al., "Simultaneous two-color lasing in a single CdSSe heterostructure nanosheet", Semiconductor Science and Technology, May 2013, vol. 28, No. 6, article 065005, 8 pages <DOI:10.1088/0268-1242/28/6/065005>.

Fan, Z. et al., "Wafer-Scale Assembly of Highly Ordered Semiconductor Nanowire Arrays by Contact Printing", Nano Letters, Jan. 2008 (available online Aug. 2007), vol. 8, No. 1, pp. 20-25 <DOI:10.1021/nl071626r>.

Fang, X. et al., "ZnS nanostructures: From synthesis to applications", Progress in Materials Science, Feb. 2011 (available online Oct. 2010), vol. 56, No. 2, pp. 175-287 <DOI:10.1016/j.pmatsci.2010.10.001>.

Fujimoto, Y. et al., "Multi-color laser oscillation in Pr3+ doped fluoro-aluminate glass fiber pumped by 442.6 nm GaN-semiconductor laser", Electronics Letters, Dec. 2009, vol. 45, No. 25, pp. 1301-1302 <DOI:10.1049/el.2009.1892>.

Geburt, S. et al., "Low threshold room-temperature lasing of CdS nanowires", Nanotechnology, Aug. 2012, vol. 23, article 365204, 7 pages <DOI:10.1088/0957-4484/23/36/365204>.

Gorkavenko, T. et al., "Temperature dependence of the band structure of ZnS, ZnSe, ZnTe, and CdTe wurtzite-type semiconductor compounds", Semiconductors, Aug. 2007, vol. 41, No. 8, pp. 886-896 <DOI:10.1134/S1063782607080040>.

Hou, D.-D. et al., "Preparation of ultrawide ZnSe nanoribbons with the function of lasing cavity", Optoelectronics Letters, Jul. 2010 (available online Oct. 2010), vol. 6, No. 4, pp. 241-244 <DOI:10.1007/s11801-010-0030-7>.

Hu, X. et al., "High-power red-green-blue laser light source based on intermittent oscillating dual-wavelength Nd:YAG laser with a cascaded LiTaO3 superlattice", Optics Letters, Feb. 2008, vol. 33, No. 4, pp. 408-410 <DOI:10.1364/OL.33.000408>.

Huang, M. et al., "Room-Temperature Ultraviolet Nanowire Nanolasers", Science, Jun. 2001, vol. 292, No. 5523, pp. 1897-1899 <DOI:10.1126/science.1060367>.

Huang, Y. et al., "Nanowires for Integrated Multicolor Nanophotonics", Small, Jan. 2005 (available online Nov. 2004), vol. 1, No. 1, pp. 142-147 <DOI:10.1002/smll.200400030>.

Hunter, R., "Photoelectric Color Difference Meter", Journal of the Optical Society of America, Jul. 1948, vol. 38, No. 7, p. 661.

Ichino, K. et al., "Growth of ZnS and ZnCdSSe alloys on GaP using an elemental sulfur source by molecular beam epitaxy", Journal of Crystal Growth, Apr. 1994 (available online Aug. 2002), vol. 138, No. 1-4, pp. 28-34 <DOI:10.1016/0022-0248(94)90775-7>.

Ichino, K. et al., Molecular beam epitaxy and characterization of heterostructures with ZnCdSSe quaternary alloys for light emitting devices, Kyoto University, Dec. 1993 (available online Mar. 1994) [retrieved Jul. 9, 2019], 126 pages, retrieved from the Internet: <URL:https://repository.kulib.kyoto-u.ac.jp/dspace/bitstream/2433/74649/1/D_Ichino_Kunio.pdf>.

International Commission on Illumination., "CIE 15: Colorimetry Technical Report", International Commission on Illumination, 2004, 3rd edition, 82 pages.

Johnson, J. et al., "Optical Cavity Effects in ZnO Nanowire Lasers and Waveguides", Journal of Physical Chemistry B, Aug. 2003, vol. 107, No. 34, pp. 8816-8828 <DOI:10.1021/jp034482n>.

Johnson, J. et al., "Single gallium nitride nanowire lasers", Nature Materials, Oct. 2002 (available online Sep. 2002), vol. 1, pp. 106-110 <DOI:10.1038/nmat728>.

Kim, T-H. et al., "Full-colour quantum dot displays fabricated by transfer printing", Nature Photonics, Mar. 2011 (available online Feb. 2011), vol. 5, pp. 176-182 <DOI:10.1038/nphoton.2011.12>.

(56) References Cited

OTHER PUBLICATIONS

Kim, Y. et al., "CdS/CdSe lateral heterostructure nanobelts by a two-step physical vapor transport method", Nanotechnology, Mar. 2010, vol. 21, No. 14, article 145602, 5 pages <DOI:10.1088/0957-4484/21/14/145602>.

Kotani, A. et al., "EndoV/DNA ligase mutation scanning assay using microchip capillary electrophoresis and dual-color laser-induced fluorescence detection", Analytical Methods, Jan. 2012 (available online Oct. 2011), vol. 4, No. 1, pp. 58-64 <DOI:10.1039/C1AY05366C>.

Kuykendall, T. et al., "Complete composition tunability of InGaN nanowires using a combinatorial approach", Nature Materials, Oct. 2007, vol. 6, pp. 951-956 <DOI:10.1038/nmat2037>.

Kwon, S. et al., "Structural and optical properties of $CdS_xSe_{1-x}$ nanowires", Physical Review B, Nov. 2005, vol. 72, article 205312, 7 pages <DOI:10.1103/PhysRevB.72.205312>.

Lebow Corporation and Vacuum Engineering and Materials Inc., "Thin Film Evaporation Guide", Vacuum Engineering & Materials (Santa Clara, CA, 2008), 2008, 13 pages <URL:http://fliphtml5.com/cbag/cvvs/basic>.

Lin, W-Y. et al., "10m/500Mbps WDM visible light communication systems", Optics Express, Apr. 2012, vol. 20, No. 9, pp. 9919-9924 <DOI:10.1364/OE.20.009919>.

Liu, Y. et al., "Wavelength-Controlled Lasing in $Zn_xCd_{1-x}S$ Single-Crystal Nanoribbons", Advanced Materials, Jun. 2005 (available online May 2005), vol. 17, No. 11, pp. 1372-1377 <DOI:10.1002/adma.200401606>.

Liu, Z. et al., "Dynamical Color-Controllable Lasing with Extremely Wide Tuning Range from Red to Green in a Single Alloy Nanowire Using Nanoscale Manipulation", Nano Letters, Sep. 2013, vol. 13, No. 10, pp. 4945-4950 <DOI:10.1021/nl4029686>.

Lu, Y. Y et al., "Multicolour laser from a single bandgap-graded CdSSe alloy nanoribbon", Optics Express, Sep. 2013, vol. 21, No. 19, pp. 22314-22319 <DOI:10.1364/OE.21.022314>.

Marques, M. et al., "Statistical model applied to $A_xB_yC_{1-x-y}D$ quaternary alloys: Bond lengths and energy gaps of $Al_xGa_yIn_{1-x-y}X$ (X=As, P, or N) systems", Physical Review B, Jun. 2006, vol. 73, No. 23, article 232205, 8 pages <DOI:10.1103/PhysRevB.73.235205>.

Maslov, A. et al., "Modal gain in a semiconductor nanowire laser with anisotropic bandstructure", IEEE Journal of Quantum Electronics, Oct. 2004 (available online Sep. 2004), vol. 40, No. 10, pp. 1389-1397 <DOI:10.1109/JQE.2004.834767>.

Moon, G. et al., "Chemical transformations of nanostructured materials", Nanotoday, Apr. 2011 (available online Mar. 2011), vol. 6, No. 2, pp. 186-203 <DOI:10.1016/j.nantod.2011.02.006>.

Moore, D. et al., "Growth of anisotropic one-dimensional ZnS nanostructures", Journal of Materials Chemistry, Jun. 2006, vol. 16, No. 40, pp. 3898-3905 <DOI.10.1039/B607902B>.

Naderi, N. et al., "Two-color multi-section quantum dot distributed feedback laser", Optics Express, Dec. 2010, vol. 18, No. 26, pp. 27026-27035 <DOI:10.1364/OE18.027028>.

Neumann, A. et al., "Four-color laser white illuminant demonstrating high color-rendering quality", Optics Express, Jul. 2011, vol. 19, No. S4, pp. A982-A990 <DOI:10.1364/OE.19.00A982>.

Okazaki, K. et al., "Lasing characteristics of an optically pumped single ZnO nanosheet", Optics Express, Oct. 2011, vol. 19, No. 21, pp. 20389-20394 <DOI:10.1364/OE.19.020389>.

Oulton, R. et al., "Plasmon lasers at deep subwavelength scale", Nature, Oct. 2009 (available online Aug. 2009), vol. 461, pp. 629-632 <DOI:10.1038/nature08364>.

Palmer, D., "The Semiconductors-Information Webstie", Semiconductor Scientists, Engineers and Technologists across the world, 2001 [retrieved from the internet Jul. 9, 2019 from archive.org, as it appeared on Mar. 1, 2001], retrieved from the internet: <URL:https://web.archive.org/web/20010301154808/http://www.semiconductors.co.uk/>.

\* cited by examiner ed herein are, for example, capable of operation in other orientations than those illustrated or otherwise described herein.

METHODS OF PROVIDING SEMICONDUCTOR DEVICES AND SEMICONDUCTOR DEVICES THEREOF

CROSS-REFERENCE TO RELATED APPLICATIONS

This application is a continuation of International Patent Application Ser. No. PCT/US2016/035550, filed Jun. 2, 2016. International Patent Application Ser. No. PCT/US2016/035550 claims the benefit of U.S. Provisional Patent Application Ser. No. 62/169,753, filed Jun. 2, 2015. International Patent Application Ser. No. PCT/US2016/035550, and U.S. Provisional Patent Application Ser. No. 62/169,753 are incorporated by reference herein in their entirety.

STATEMENT REGARDING FEDERALLY SPONSORED RESEARCH OR DEVELOPMENT

This invention was made with government support under W911NF-08-1-0471 awarded by the Army Research Office. The government has certain rights in the invention.

FIELD OF THE INVENTION

This invention relates generally to cases for electrical devices, and relates more particularly to such cases that provide easy access to and protection of electrical devices and methods of using the same.

DESCRIPTION OF THE BACKGROUND

Numerous technologies, including solid state lighting, laser lighting, full-color imaging and displays, visible color communications, multi-color fluorescing, biological and chemical detection, on-chip wavelength-division multiplexing (WDM), etc., could be improved by implementing such technologies with semiconductor devices configured to emit light over more of the visible spectrum. Monolithic semiconductor devices configured to emit white light would be particularly advantageous. However, the intrinsic difficulties of epitaxially growing mismatched materials have thus far prevented monolithic semiconductor devices configured to emit white light from being manufactured. Accordingly, a need or potential for benefit exists for monolithic semiconductor devices configured to emit white light and for methods of manufacturing monolithic semiconductor devices configured to emit white light.

BRIEF DESCRIPTION OF THE DRAWINGS

To facilitate further description of the embodiments, the following drawings are provided in which.

Figure 1:
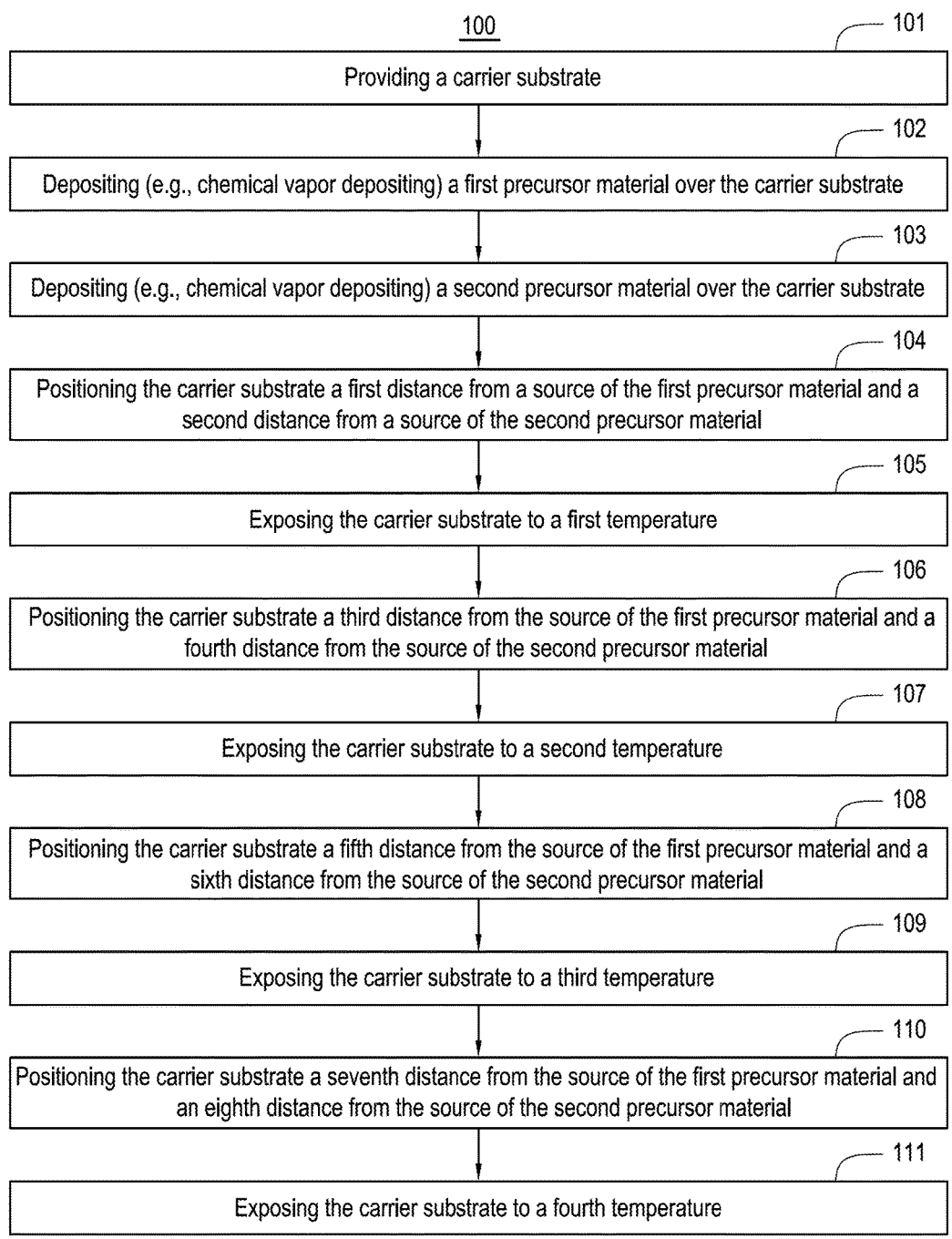
FIG. 1 illustrates a flow chart for an embodiment of a method.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

The term "approximately" can, in some embodiments, mean within plus or minus ten percent of the stated value. In other embodiments, "approximately" can mean within plus or minus five percent of the stated value. In further embodiments, "approximately" can mean within plus or minus three percent of the stated value. In yet other embodiments, "approximately" can mean within plus or minus one percent of the stated value.

The term "compound composition" can refer to the percentage compositions of the components of a compound. Further, the term alloy composition can refer to the percentage compositions of the components of an alloy.

DETAILED DESCRIPTION OF EXAMPLES OF EMBODIMENTS

Some embodiments can include a method. The method can comprise: providing a carrier substrate; forming a first device material over the carrier substrate; and after forming the first device material over the carrier substrate, transforming the first device material into a second device material. Meanwhile, the transforming the first device material into the second device material can comprise: causing a cationic exchange in the first device material; and causing an anionic exchange in the first device material. Further, the causing the cationic exchange in the first device material and the causing the anionic exchange in the first device material can occur approximately simultaneously.

Further embodiments can include a method. The method can comprise: providing a carrier substrate; depositing a first precursor material over the carrier substrate; depositing a second precursor material over the carrier substrate; and while depositing the first precursor material over the carrier substrate, and while depositing the second precursor material over the carrier substrate: positioning the carrier substrate a first distance from a source of the first precursor material and a second distance from a source of the second precursor material; after positioning the carrier substrate the first distance from the source of the first precursor material and the second distance from the source of the second precursor material, positioning the carrier substrate a third distance from the source of the first precursor material and a fourth distance from the source of the second precursor material; after positioning the carrier substrate the third distance from the source of the first precursor material and the fourth distance from the source of the second precursor material, positioning the carrier substrate a fifth distance from the source of the first precursor material and a sixth distance from the source of the second precursor material; and after positioning the carrier substrate the fifth distance from the source of the first precursor material and the sixth distance from the source of the second precursor material, positioning the carrier substrate a seventh distance from the source of the first precursor material and an eighth distance from the source of the second precursor material. Meanwhile, the positioning the carrier substrate the first distance from the source of the first precursor material and the second distance from the source of the second precursor material can comprise exposing the carrier substrate to a first temperature; the positioning the carrier substrate the third distance from the source of the first precursor material and the fourth distance from the source of the second precursor material can comprise exposing the carrier substrate to a second temperature; the positioning the carrier substrate the fifth distance from the source of the first precursor material and the sixth distance from the source of the second precursor material can comprise exposing the carrier substrate to a third temperature; and the positioning the carrier substrate the seventh distance from the source of the first precursor material and the eighth distance from the source of the second precursor material can comprise exposing the carrier substrate to a fourth temperature. Further, the second temperature can be greater than the first temperature, the third temperature can be greater than the first temperature and less than the second temperature, and the fourth temperature can comprise the first temperature.

Still further embodiment can include a system. The system can comprise a unitary semiconductor device. The unitary semiconductor device can comprise a first semiconductor device portion configured to emit visible blue light, a second semiconductor device portion configured to emit visible green light, and a third semiconductor device portion configure to emit visible red light. Meanwhile, the first semiconductor device portion, the second semiconductor device portion, and the third semiconductor device portion can be monolithically integrated with each other.

Turning now to the drawings, FIG. 1 illustrates a flow chart for an embodiment of method 100. Method 100 is merely exemplary and is not limited to the embodiments presented herein. Method 100 can be employed in many different embodiments or examples not specifically depicted or described herein. In some embodiments, the activities of method 100 can be performed in the order presented. In other embodiments, the activities of method 100 can be performed in any other suitable order. In still other embodiments, one or more of the activities in method 100 can be combined or skipped.

In many embodiments, method 100 can comprise a method of providing (e.g., manufacturing) a semiconductor device. In some embodiments, the semiconductor device can be similar or identical to semiconductor device 300 (FIG. 3), as discussed below. In these or other embodiments, method 100 can permit a composition and morphology of the semiconductor device, including one or more constituent portions of the semiconductor device, to be independently controlled. Method 100 was developed using systematic efforts to understand and control the interplay of various growth mechanisms, including a vapor-liquid-solid (VLS) growth mechanism, a vapor-solid (VS) growth mechanism, and a dual-ion exchange mechanism (e.g., activity 1501 (FIG. 3) and activity 1502 (FIG. 3)). Method 100 (FIG. 1)

can permit growth of multi-segment heterostructure nanosheets of quaternary alloys, which in some embodiments, can be configured to emit blue, green, and red light.

Figure 11:
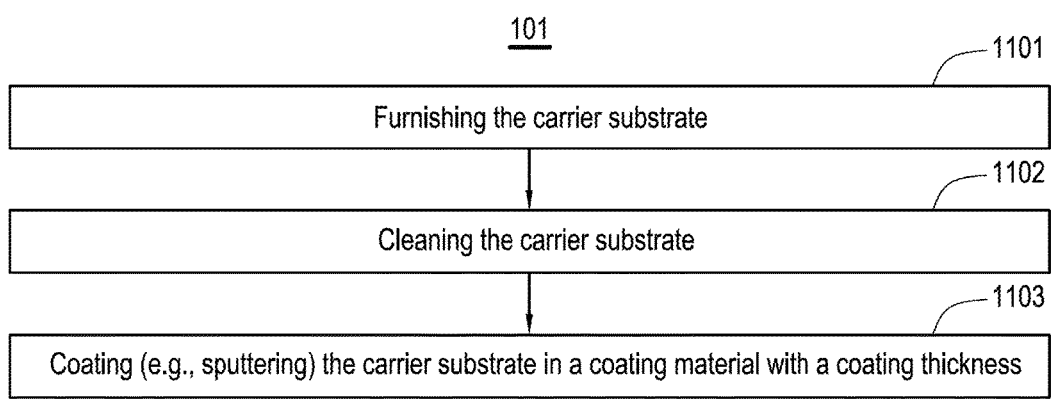
FIG. 11 illustrates an exemplary activity of providing a carrier substrate, according to the embodiment of FIG. 1.

In many embodiments, method 100 can comprise activity 101 of providing a carrier substrate. In some embodiments, the carrier substrate can comprise any suitable carrier substrate material or materials, but in many embodiments, the carrier substrate material(s) can comprise one or more glass materials (e.g., silicon, amorphous silicon, silicon nitride, silicon dioxide, barium borosilicate, soda lime silicate, alkali silicate, silicon-oxygen tetrahedral, etc.). The carrier substrate can be operable as a mechanical support for a semiconductor device provided by method 100. FIG. 11 illustrates an exemplary activity 101, according to the embodiments of FIG. 1.

For example, activity 101 can comprise activity 1101 of furnishing the carrier substrate. Meanwhile, in some embodiments, activity 101 can comprise activity 1102 of cleaning the carrier substrate; and/or activity 101 can comprise activity 1103 of coating (e.g., sputtering) the carrier substrate in a coating material with a coating thickness. For example, the coating material can comprise a metal (e.g., gold), and the coating thickness can be approximately 10 nanometers.

Returning again to FIG. 1, in many embodiments, method 100 can comprise activity 102 of depositing (e.g., chemical vapor depositing) a first precursor material over the carrier substrate; and/or method 100 can comprise activity 103 of depositing (e.g., chemical vapor depositing) a second precursor material over the carrier substrate. In some embodiments, activity 102 and activity 103 can be performed simultaneously or approximately simultaneously with each other.

In these or other embodiments, activity 102 and/or activity 103 can be performed while the carrier substrate is positioned in a reaction chamber of a deposition reactor (e.g., a chemical vapor deposition reactor). For example, the reaction chamber can comprise a single zone chemical vapor deposition horizontal tube, having any suitable length and width. In some embodiments, the length can be approximately 4 feet and the width can be approximately 1.5 inches.

In these embodiments, when activity 102 and/or activity 103 are performed, a source of the first precursor material and/or a source of the second precursor material can be positioned in the reaction chamber. When method 100 comprises both activity 102 and activity 103, in some embodiments, the source of the first precursor material and the source of the second precursor material can be positioned in the same or approximately same position in the reaction chamber, but in other embodiments, the source of the first precursor material and the source of the second precursor material can be positioned at different positions in the reaction chamber.

When activity 102 is performed, in some embodiments, the source of the first precursor material can be positioned 12 centimeters upstream of center of the reaction chamber. In these or other embodiments, the source of the first precursor material can be exposed to a temperature of approximately 840 degrees Celsius. Meanwhile, when activity 103 is performed, in some embodiments, the source of the second precursor can be positioned at approximately the center of the reaction chamber. In these or other embodiments, the source of the second precursor material can be exposed to a temperature of approximately 980 degrees Celsius.

In many embodiments, the first precursor material and/or the second precursor material can be implemented in powdered form. However, in other embodiments, the first precursor material and/or the second precursor material can be implemented in any other suitable form.

Prior to performing activity 102 and/or activity 103, the reaction chamber can be evacuated to a pressure of approximately 4.000 pascals. In these or other embodiments, the reaction chamber can be purged of oxygen using an inert gas flow of nitrogen at a rate of 10 standard cubic centimeters per minute for 30 minutes. Then, when performing activity 102 and/or activity 103, the reaction chamber can be set to a pressure of approximately 1333 pascals and backfilled with nitrogen gas at a flow rate of 10 standard cubic centimeters per minute. A furnace can be used to heat the reaction chamber so that the applicable temperatures discussed for activity 102, activity 103, activity 105, activity 107, activity 109, and/or activity 111 are achieved. After activity 102 and/or activity 103 are completed, the furnace can be turned off and the reaction chamber can be permitted to cool down naturally to room temperature while maintaining the flow of nitrogen gas. In some embodiments, each of activities 201-204 can be limited to approximately 12 minutes or less, and in these or other embodiments, all of activities 201-204 can be limited to approximately 45 minutes or less, to prevent depletion of the first source material and/or the second source material.

Figure 2:
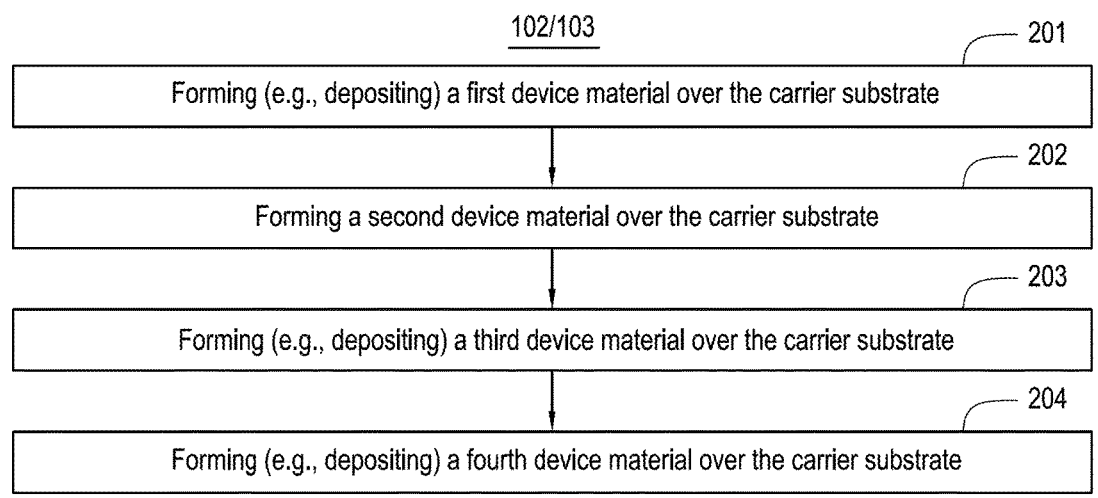
FIG. 2 illustrates an exemplary activity of depositing (e.g., chemical vapor depositing) a first precursor material over a carrier substrate and/or an exemplary activity of depositing (e.g., chemical vapor depositing) a second precursor material over the carrier substrate, according to the embodiment of FIG. 1.

Turning ahead in the drawings, FIG. 2 illustrates an exemplary activity 102 and/or activity 103, accordingly to the embodiment of FIG. 1.

For example, activity 102 and/or activity 103 can comprise activity 201 of forming (e.g., depositing) a first device material over the carrier substrate. In some embodiments, the first device material can comprise a first compound (e.g., a first alloy). For example, the first compound can comprise a first quaternary compound (e.g., a first quaternary alloy). Further, when the first device material comprises a first compound, the first compound can comprise a first compound composition (e.g., a first alloy composition). In many embodiments, the first device material can comprise a zinc-cadmium-sulfur-selenium (ZnCdSSe) quaternary alloy rich in cadmium and selenium. In these embodiments, the first device material can emit red light when exposed to ambient lighting.

Further, activity 102 and/or activity 103 can comprise activity 202 of forming a second device material over the carrier substrate. In these or other embodiments, activity 202 can be performed after activity 201. In some embodiments, the second device material can comprise a second compound (e.g., a second alloy). For example, the second compound can comprise a second quaternary compound (e.g., a second quaternary alloy). Further, when the second device material comprises a second compound, the second compound can comprise a second compound composition (e.g., a second alloy composition). In many embodiments, the second device material can comprise a zinc-cadmium-sulfur-selenium (ZnCdSSe) quaternary alloy rich in zinc and selenium. In these embodiments, the second device material can emit blue light when exposed to ambient lighting.

Figure 15:
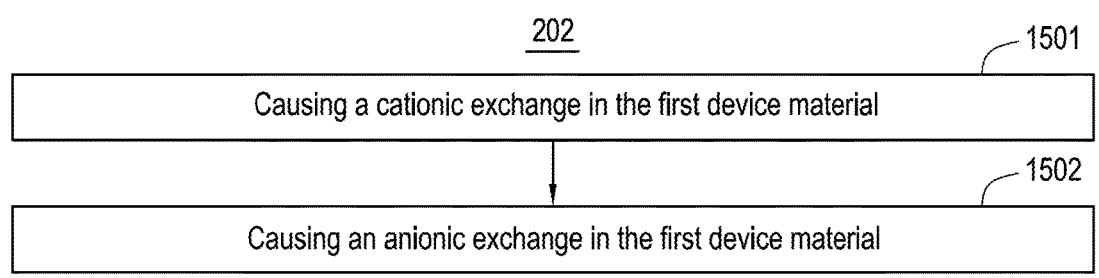
FIG. 15 illustrates an exemplary method of transforming the first device material into the second device material, according to the embodiment of FIG. 1.

In many embodiments, activity 202 can comprise method 1500 of transforming the first device material into the second device material. FIG. 15 illustrates an exemplary method 1500, according to the embodiment of FIG. 1.

For example, method 1500 can comprise activity 1501 of causing a cationic exchange in the first device material; and/or activity 1502 of causing an anionic exchange in the first device material. In many embodiments, activity 1501 and/or activity 1502 can be performed simultaneously or approximately simultaneously with each other. In these or other embodiments, method 1500 can comprise activity 106

(FIG. 1) and/or activity 107 (FIG. 1), and activity 106 (FIG. 1) and/or activity 107 (FIG. 1) can comprise activity 1501 and/or activity 1502.

In many embodiments, method 1500 can advantageously permit a compound composition of a device material (e.g., the first device material) to be changed without altering the morphology of the material. As a result, a composition of device materials can be controlled independently of a morphology of the device materials.

For example, when zinc sulfide (ZnS) is alloyed with a cadmium-sulfur-selenium (CdSSe) ternary alloy by conventional epitaxial growth methods, the low vapor pressure and low supersaturation of zinc sulfide (ZnS) can cause zinc sulfide (ZnS) dominant alloys to grow into nanowires or nanoribbons with high length-width aspect ratios (e.g., aspect ratios greater than or equal to approximately 28 and less than or equal to approximately 30). However, as discussed in greater detail below, it may be desirable to alloy zinc with cadmium, sulfur, and selenium in a planar morphology. Accordingly, method 1500 can permit zinc to be alloyed with cadmium, sulfur, and selenium in a planar morphology comprising an aspect ratio of less than approximately 20, 15, 10, 5, 3, or 2.

In some embodiments, the cationic exchange of activity 1501 can occur at a faster rate than the anionic exchange of activity 1502. For example, the cationic exchange can be approximately 2.3-2.4 times faster than the anionic exchange.

Referring now back to FIG. 2, in some embodiments, activity 102 and/or activity 103 can comprise activity 203 of forming (e.g., depositing) a third device material over the carrier substrate, such as, for example, next to the second device material. In these or other embodiments, activity 203 can be performed after activity 202. In some embodiments, activity 203 can be omitted.

In some embodiments, the third device material can comprise a third compound (e.g., a third alloy). For example, the third compound can comprise a third quaternary compound (e.g., a third quaternary alloy). Further, when the third device material comprises a third compound, the third compound can comprise a third compound composition (e.g., a third alloy composition). In many embodiments, the third device material can comprise a zinc-cadmium-sulfur-selenium (ZnCdSSe) quaternary alloy rich in cadmium and sulfur. In these embodiments, the third device material can emit green light when exposed to ambient lighting.

In further embodiments, activity 102 and/or activity 103 can comprise activity 204 of forming (e.g., depositing) a fourth device material over the carrier substrate, such as, for example, next to the third device material. In these or other embodiments, activity 204 can be performed after activity 203. In some embodiments, activity 204 can be omitted.

In some embodiments, the fourth device material can comprise a fourth compound (e.g., a third alloy). For example, the fourth compound can comprise a fourth quaternary compound (e.g., a fourth quaternary alloy). Further, when the fourth device material comprises a fourth compound, the fourth compound can comprise a fourth compound composition (e.g., a fourth alloy composition). In many embodiments, the fourth device material can comprise a zinc-cadmium-sulfur-selenium (ZnCdSSe) quaternary alloy rich in cadmium and selenium. In these embodiments, the fourth device material can emit red light when exposed to ambient lighting.

In many embodiments, the first device material can comprise the second device material, the third device material, and/or the fourth device material. That is, the first device material, the second device material, the third device material, and/or the fourth device material can be the same as each other. In these or other embodiments, when two or more of these device materials comprise compounds, two or more of the first compound composition, the second compound composition, the third compound composition, and the fourth compound composition, as applicable, can be the same as each other and/or can be different from each other.

For example, the first quaternary alloy can comprise the second quaternary alloy, the third quaternary alloy, and the fourth quaternary alloy. Meanwhile, the first alloy composition, the second alloy composition, and the third alloy composition can be different from each other, and the first alloy composition can comprise the fourth alloy composition. That is, the first alloy composition can be the same as the fourth alloy composition.

The materials selected for the first precursor material and/or the second precursors material can depend on the first device material (e.g., first compound), the second device material (e.g., second compound), the third device material (e.g., third compound), and/or the fourth device material (e.g., fourth compound) that is/are desired. For example, selecting a first binary compound (e.g., a first binary alloy) for the first precursor material, and/or a second binary compound (e.g., a second binary alloy) for the second precursor material can result in the first device material (e.g., first compound), the second device material (e.g., second compound), the third device material (e.g., third compound), and/or the fourth device material (e.g., fourth compound) comprising a quaternary compound (e.g., a quaternary alloy). In some embodiments, the first precursor material can comprise cadmium selenide (CdSe), and the second precursor material can comprise zinc sulfide (ZnS). In these or other embodiments, the first device material, the second device material, the third device material, and/or the fourth device material can comprise a zinc-cadmium-sulfur-selenium (ZnCdSSe) quaternary alloy, an indium-gallium-nitrogen (InGaN) ternary alloy, a magnesium-cadmium-selenium (MgCdSe) ternary alloy, or a magnesium-cadmium-sulfur-selenium (MgCdSSe) quaternary alloy. As explained in greater detail below, implementing the first device material, the second device material, the third device material, and/or the fourth device material to comprise a zinc-cadmium-sulfur-selenium (ZnCdSSe) quaternary alloy can be advantageous to manufacture semiconductor devices configured to emit light blue, green, and red light.

As discussed in greater detail below with respect to activities 104-111 (FIG. 1), in many embodiments, the device materials formed by performing one or more of activities 201-204 can result from controlling the position and/or temperature of the substrate at the reaction chamber when performing activities 102 and 103 (FIG. 1). In particular, when one or more of the device materials formed at one or more of activities 201-204 comprise one or more compounds (e.g., one or more alloys), the compound composition(s) of the device material(s) can be controlled by controlling the position and/or temperature of the substrate. In many embodiments, the temperature can be controlled by changing the position of the substrate at the reaction chamber, such as, for example, by coupling the substrate to a metal (e.g., iron) rod and moving the metal rod with a magnet external from the reaction chamber, as desired.

Meanwhile, growth of device materials at low levels of supersaturation can be dominated by the catalyst-led vapor-liquid-solid (VLS) growth mechanism, producing higher aspect ratio semiconductor devices, and growth of device materials at high levels of supersaturation can be dominated by the vapor-solid (VS) growth mechanism, providing lower aspect ratio semiconductor devices. Accordingly, implementing temperatures for activity 105 (FIG. 1), activity 107 (FIG. 1), activity 109 (FIG. 1), and/or activity 111 (FIG. 1) that favor the vapor-solid (VS) growth mechanism for the particular device materials and/or compound composition may provide for lower aspect ratio semiconductor devices.

In many embodiments, activity 102 (FIG. 1) and/or activity 103 (FIG. 1) can be performed without interruption. For example, in these embodiments, activity 201 can transition directly to activity 202, activity 202 can transition directly to activity 203, and activity 203 can transition direct to activity 204. In other words, activity 102 (FIG. 1) and/or activity 103 (FIG. 1) can be performed with a single run of the reaction chamber.

Turning now back to FIG. 1, in many embodiments, method 100 can comprise activity 104 of positioning the carrier substrate a first distance from a source of the first precursor material and a second distance from a source of the second precursor material. In some embodiments, the first distance can be greater than the second distance.

In many embodiments, method 100 can comprise activity 105 of exposing the carrier substrate to a first temperature. In some embodiments, the first temperature can comprise approximately 640 degrees Celsius.

In some embodiments, activity 104 can comprise activity 105. In many embodiments, two or more of activity 102, activity 103, activity 104, and/or activity 105 can be performed simultaneously or approximately simultaneously with each other. Further, in many embodiments, activity 104 and/or activity 105 can occur simultaneously or approximately simultaneously with activity 201 (FIG. 2)

In many embodiments, method 100 can comprise activity 106 of positioning the carrier substrate a third distance from the source of the first precursor material and a fourth distance from the source of the second precursor material. In some embodiments, the third distance can be less than the first distance and/or the fifth distance; and/or the fourth distance can be less than the second distance and/or the sixth distance. In these or other embodiments, the third distance can be greater than the fourth distance.

In many embodiments, method 100 can comprise activity 107 of exposing the carrier substrate to a second temperature. In some embodiments, the second temperature can be greater than the first temperature. For example in various embodiments, the second temperature can comprise approximately 780 degrees Celsius.

In some embodiments, activity 106 can comprise activity 107. In these or other embodiments, activity 106 and/or activity 107 can be performed after activity 104 and/or activity 105. In many embodiments, two or more of activity 102, activity 103, activity 106, and/or activity 107 can be performed simultaneously or approximately simultaneously with each other. Further, in many embodiments, activity 106 and/or activity 107 can occur simultaneously or approximately simultaneously with activity 202 (FIG. 2).

In many embodiments, method 100 can comprise activity 108 of positioning the carrier substrate a fifth distance from the source of the first precursor material and a sixth distance from the source of the second precursor material. In some embodiments, the fifth distance is less than the first distance and/or greater than the third distance; and/or the sixth distance can be less than the second distance and/or greater than the fourth distance. In these or other embodiments, the fifth distance can be greater than the sixth distance.

In many embodiments, method 100 can comprise activity 109 of exposing the carrier substrate to a third temperature.

In some embodiments, the third temperature can be greater than the first temperature and/or less than the second temperature. For example, in various embodiments, the third temperature can comprise approximately 740 degrees Celsius.

In some embodiments, activity 108 can comprise activity 109. In these or other embodiments, activity 108 and/or activity 109 can be performed after one or more of activities 104-107. In many embodiments, two or more of activity 102, activity 103, activity 108, and/or activity 109 can be performed simultaneously or approximately simultaneously with each other. Further, in many embodiments, activity 108 and/or activity 109 can occur simultaneously or approximately simultaneously with activity 203 (FIG. 2). Still, in other embodiments, activity 108 and/or activity 109 can be omitted.

In many embodiments, method 100 can comprise activity 110 of positioning the carrier substrate a seventh distance from the source of the first precursor material and an eighth distance from the source of the second precursor material. In some embodiments, the seventh distance can comprise the first distance, and/or the eighth distance can comprise the second distance. That is, the seventh distance and the first distance can be the same or approximately same as each other, and/or the eighth distance and the second distance can be the same or approximately same as each other. In these or other embodiments, the seventh distance can be greater than the eighth distance.

In many embodiments, method 100 can comprise activity 111 of exposing the carrier substrate to a fourth temperature. In some embodiments, the fourth temperature can comprise the first temperature. That is, the fourth temperature and the first temperature can be the same or approximately the same as each other. For example, in various embodiments, the fourth temperature can comprise approximately 640 degrees Celsius.

In some embodiments, activity 110 can comprise activity 111. In these or other embodiments, activity 110 and/or activity 111 can be performed after one or more of activities 104-109. In many embodiments, two or more of activity 102, activity 103, activity 110, and/or activity 111 can be performed simultaneously or approximately simultaneously with each other. Further, in many embodiments, activity 110 and/or activity 111 can occur simultaneously or approximately simultaneously with activity 201 (FIG. 2). Still, in other embodiments, activity 110 and/or activity 111 can be omitted.

Although method 100, activity 102, and/or activity 103 are described with respect to four device materials (i.e., the first device material, the second device material, the third device material, and the fourth device material), in other embodiments, method 100, activity 102, and/or activity 103 can be implemented with any other number of device materials greater than one device material. Further, although method 100, activity 102, and/or activity 103 are described as involving one device material transformation (i.e., from the first device material to the second device material), in these or other embodiments, method 100, activity 102, and/or activity 103 can be implemented with any desired number of device material transformations and in any desired order. Further still, although activities 104-111 are described with respect to particular position and temperature characteristics, in other embodiments, the positions and/or temperatures implemented can depend on the materials implemented, the compound compositions desired, the device morphologies desired, and/or the colors of light emissions desired. In these or other embodiments, when additional device materials are implemented, the deposition and/or transformation times can be reduced, as needed, to prevent source depletion.

Figure 3:
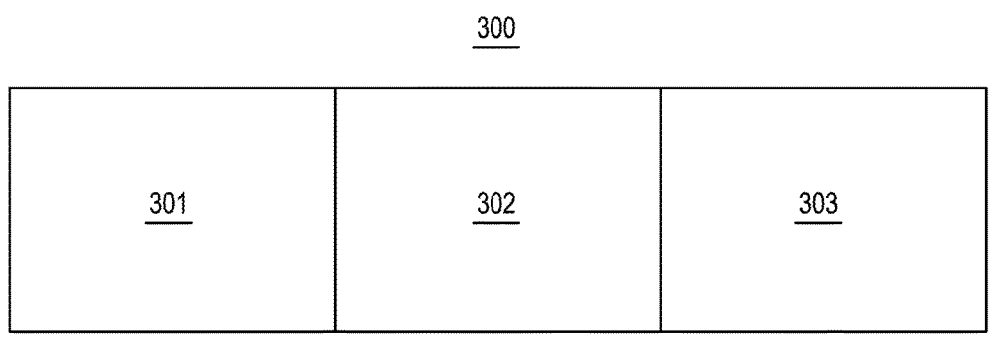
FIG. 3 illustrates a cross-sectional view of an exemplary semiconductor device, according to an embodiment.

Turning ahead in the drawings, FIG. 3 illustrates a cross-sectional view of an exemplary semiconductor device 300, according to an embodiment. In many embodiments, method 100 (FIG. 1) can be implemented to provide (e.g., manufacture) semiconductor device 300. Semiconductor device 300 is merely exemplary and is not limited to the embodiments presented herein. Semiconductor device 300 can be employed in many different embodiments or examples not specifically depicted or described herein.

Semiconductor device 300 can comprise an emitter or a detector. Accordingly, in various embodiments, semiconductor device 300 can be suitable for implementation with numerous technologies, including solid state lighting, laser lighting, full-color imaging and displays, visible color communications, multi-color fluorescing, biological and chemical detection, on-chip wavelength-division multiplexing (WDM), etc. For example, semiconductor device 300 can comprise a light emitting diode (LED), a laser, etc. In many embodiments, semiconductor device 300 can comprise a monolithic white LED or a monolithic white laser. Meanwhile, in other embodiments, semiconductor device 300 can comprise a photodiode.

In many embodiments, semiconductor device 300 can be operable to emit light over part of, a majority of, approximately all of, or all of the visible color spectrum. For example, in some embodiments, semiconductor device 300 can be operable to emit light covering approximately 50-70 percent more of the visible color spectrum than conventional semiconductor devices. Further, in these or other embodiments, semiconductor device 300 can emit light over bandwidth of greater than or equal to approximately 191 nanometers. Meanwhile, implementing semiconductor device 300 to comprise a white laser can provide numerous advantages over conversional white light emitting semiconductor devices. For example, because semiconductor device 300 can comprise a laser configured to emit white light, semiconductor device 300 can provide higher energy conversion efficiencies and/or potential output power than conventional white light emitting semiconductor devices.

In many embodiments, semiconductor device 300 can comprise first semiconductor device portion 301, second semiconductor device portion 302, and third semiconductor device portion 303. First semiconductor device portion 301, second semiconductor device portion 302, and third semiconductor device portion 303 each can be configured to emit light (e.g., monochromatic light).

For example, first semiconductor device portion 301 can be configured to emit visible blue light. In these or other embodiments, first semiconductor device portion 301 can be configured to emit visible light comprising a wavelength of greater than or equal to approximately 440 nanometers and less than or equal to approximately 490 nanometers. Further, first semiconductor device portion 301 can be configured to emit visible light comprising a wavelength of greater than or equal to approximately 475±10 nanometers or 475±15 nanometers.

In many embodiments, first semiconductor device portion 301 can comprise a first semiconductor device portion material. The first semiconductor device portion material can be similar or identical to the second device material described above with respect to method 100 (FIG. 1).

In these or other embodiments, second semiconductor device portion 302 can be configured to emit visible green light. In these or other embodiments, second semiconductor device portion 302 can be configured to emit visible light comprising a wavelength of greater than or equal to approximately 510 nanometers and less than or equal to approximately 560 nanometers.

In many embodiments, second semiconductor device portion 302 can comprise a second semiconductor device portion material. The second semiconductor device portion material can be similar or identical to the third device material described above with respect to method 100 (FIG. 1).

In these or other embodiments, third semiconductor device portion 303 can be configured to emit visible red light. In these or other embodiments, second semiconductor device portion 302 can be configured to emit visible light comprising a wavelength of greater than or equal to approximately 620 nanometers and less than or equal to approximately 700 nanometers.

In many embodiments, third semiconductor device portion 303 can comprise a third semiconductor device portion material. The third semiconductor device portion material can be similar or identical to the fourth device material described above with respect to method 100 (FIG. 1).

In many embodiments, the first semiconductor device portion material, the second semiconductor device portion material, and the third semiconductor device portion material each can comprise a zinc-cadmium-sulfur-selenium (ZnCdSSe) quaternary alloy, and the alloy composition of each of the first semiconductor device portion material, the second semiconductor device portion material, and the third semiconductor device portion material can be different to permit light emissions in blue, green, and red.

Semiconductor device 300 can comprise a length of less than or equal to approximately 60 micrometers, a width of less than or equal to approximately 45 micrometers, and/or a thickness of greater than or equal to approximately 60 nanometers and less than or equal to approximately 350 nanometers. In some specific embodiments, the length can be approximately 4.9±1.3 micrometers, approximately 10.9±1.4 micrometers, or approximately 16.8±1.4 micrometers. Further, in further embodiments, the thickness of semiconductor device 300 can be greater than or equal to approximately 220 nanometers and less than or equal to approximately 300 nanometers. Meanwhile, semiconductor device 300 (e.g., first semiconductor device portion 301, second semiconductor device portion 302, and third semiconductor device portion 303) can comprise high-quality wurtzite monocrystal, with no visible defects or strains detected.

When the semiconductor device portion materials (e.g., the first semiconductor device portion material, the second semiconductor device portion material, and the third semiconductor device portion material) of semiconductor device 300 comprise a zinc-cadmium-sulfur-selenium (ZnCdSSe) quaternary alloy, the concentrations of zinc, cadmium, sulfur, and selenium can vary across semiconductor device 300. In further embodiments, the (010)-plane and (001)-plane spacings and emission wavelengths along semiconductor device 300 can be extrapolated and correlated with the measured values using high resolution transmission election microscopy (HRTEM) images and photoluminescence (PL) spectra.

In some embodiments, an energy dispersive spectroscopy (EDS) analysis and elemental mapping of semiconductor device 300 can show that a relative abundance of anions does not change as much as that of cations when performing method 1500 (FIG. 3), assuming the first semiconductor device material had approximately the same composition before and after performing method 1500 (FIG. 3). Accordingly, in these embodiments, the cation exchange process can be faster than the anion exchange process, which can result due to the inhibited diffusion of the larger anions.

Although semiconductor device 300 is described with respect to three semiconductor device portions (e.g., first semiconductor device portion 301, second semiconductor device portion 302, and third semiconductor device portion 303), in other embodiments, semiconductor device 300 can be implemented with more than three device portions. For example, it was recently demonstrated that illumination with four monochromatic lasers can be visually equivalent to a continuous-spectrum white reference illuminant as seen by the human eye. Accordingly, it may be advantageous to implement semiconductor device 300 with more than three device portions to cover more of the visible color spectrum. Further, by configuring each of the semiconductor device portions (e.g., first semiconductor device portion 301, second semiconductor device portion 302, and third semiconductor device portion 303) to emit monochromatic light, it is possible to achieve a wider color gamut (e.g., greater than or equal to ninety percent of the visible color spectrum), a higher contrast ratio, and more vivid colors than conventional broadband semiconductor devices permit.

In many embodiments, semiconductor device 300 can comprise a single monolithic multi-segment semiconductor nanosheet. For example, semiconductor device 300 can comprise a unitary semiconductor device. Accordingly, in many embodiments, first semiconductor device portion 301, second semiconductor device portion 303, and third semiconductor device portion 303 can be monolithically integrated with each other. In other words, first semiconductor device portion 301, second semiconductor device portion 303, and third semiconductor device portion 303 can be arranged parallel and planar to each other with first semiconductor device portion 301 directly coupled to second semiconductor device portion 302 and with second semiconductor device portion 302 directly coupled to third semiconductor device portion 30.

In many embodiments, because the semiconductor device portions (e.g., first semiconductor device portion 301, second semiconductor device portion 302, and third semiconductor device portion 303) of semiconductor device 300 can be monolithically integrated, semiconductor device 300 can be less voluminous, more efficient, and/or more compatible with electrical injection than conventional devices configured to emit white light that are manufactured using non-semiconductor materials, such as, for example, nonlinear optical crystal materials, rare-earth doped materials, dye-doped polymer materials, liquid materials, or microfibers. Further, electronic devices incorporating semiconductor device 300 can also be less voluminous, less complex, and/or less costly.

Meanwhile, semiconductor device 300 can overcome various limitations of previous attempts to manufacture semiconductor devices configured to emit light over more of the visible color spectrum (e.g., attempts implementing quantum dot and/or nanowire semiconductor devices). When manufactured with solution-based techniques, quantum dot semiconductor devices suffer from spatial distribution problems that can cause absorption of short wavelength emissions. Meanwhile, nanowire semiconductor devices structures may lack an adequate cavity structure to support lasing of all three elementary colors simultaneously. Advantageously, semiconductor device 300 can comprise cavity structures configured to support lasing of all three elementary colors simultaneously and can comprise sufficient spatial distribution to minimize absorption of short wavelength emissions. For example, as noted above, semiconductor device 300 can comprise a side-by-side cavity geometry, thereby overcoming the limitations of nanowire semiconductor devices and quantum dot semiconductor devices.

A side-by-side cavity geometry can help permit multi-color lasing. In general, a multi-segment semiconductor device can be grown with two cavity options: (i) segments for various colors grown in series along the wave propagation direction, or (ii) segments for various colors grown in parallel along the wave propagation direction. In the case of the first option, short-wavelength light (green and blue) can be strongly absorbed in the segments of narrow gap semiconductors, allowing only longer wavelengths to reach the lasing threshold. Implementing a side-by-side cavity geometry can significantly reduce the effects of this absorption and achieve simultaneous lasing in all wavelengths from those segments.

For example, consider a three-segment nanosheet semiconductor device, assuming the three segments, emit light at 455 nanometers, 530 nanometers, and 590 nanometers, respectively, and each comprise a zinc-cadmium-sulfur-selenium (ZnCdSSe) quaternary alloy with different compound compositions. The semiconductor device can be similar or identical to semiconductor device 300.

In particular, the first segment can comprise a zinc-cadmium-sulfur-selenium (ZnCdSSe) quaternary alloy with a compound composition of $Zn_{0.7}Cd_{0.3}S_{0.3}Se_{0.7}$, the second segment can comprise a zinc-cadmium-sulfur-selenium (ZnCdSSe) quaternary alloy with a compound composition of $Zn_{0.4}Cd_{0.6}S_{0.15}Se_{0.85}$, and the third segment can comprise a zinc-cadmium-sulfur-selenium (ZnCdSSe) quaternary alloy with a compound composition of $Zn_{0.25}Cd_{0.75}S_{0.05}Se_{0.95}$. Determining the bandgaps and refractive indices of these segments can help to understand the waveguiding properties of the three-segment sheet structure. The relative bandgap alignment (band edge profiles) between the neighboring segments can determine the absorption of waves propagating in the semiconductor, while the refractive index profile can impact the mode confinements within a given segment.

Linear combination of atomic orbitals (LCAO) theory can be used to calculate a valence band energy ($E_v$), of each of the relevant binaries of the zinc-cadmium-sulfur-selenium (ZnCdSSe) quaternary alloy (e.g., zinc sulfide (ZnS), zinc selenide (ZnSe), cadmium sulfide (CdS), and cadmium selenide (CdSe)) to determine the band edge profiles of each of the segments of the three-segment nanosheet. For example, linear interpolations can be used to determine a valence band energy ($E_v$), a bandgap energy ($E_g$), a conduction band energy ($E_c$), and a refractive index (n) for each of the segments, as provide for at Equations 1-4 below.

$$E_v(Zn_xCd_{1-x}S_ySe_{1-y}) = E_v(ZnS) \cdot xy + E_v(CdSe) \cdot (1-x)(1-y) + E_v(CdS) \cdot (1-x)y + E_v(ZnSe) \cdot x(1-y) \quad (1)$$

$$E_g(Zn_xCd_{1-x}S_ySe_{1-y}) = E_g(ZnS) \cdot xy + E_g(CdSe) \cdot (1-x)(1-y) + E_g(CdS) \cdot (1-x)y + E_g(ZnSe) \cdot x(1-y) \quad (2)$$

$$E_c(Zn_xCd_{1-x}S_ySe_{1-y}) = E_c(ZnS) \cdot xy + E_c(CdSe) \cdot (1-x)(1-y) + E_c(CdS) \cdot (1-x)y + E_c(ZnSe) \cdot x(1-y) \quad (3)$$

$$n(Zn_xCd_{1-x}S_ySe_{1-y}) = n(ZnS) \cdot xy + n(CdSe) \cdot (1-x)(1-y) + n(CdS) \cdot (1-x)y + n(ZnSe) \cdot x(1-y) \quad (4)$$

Figure 12:
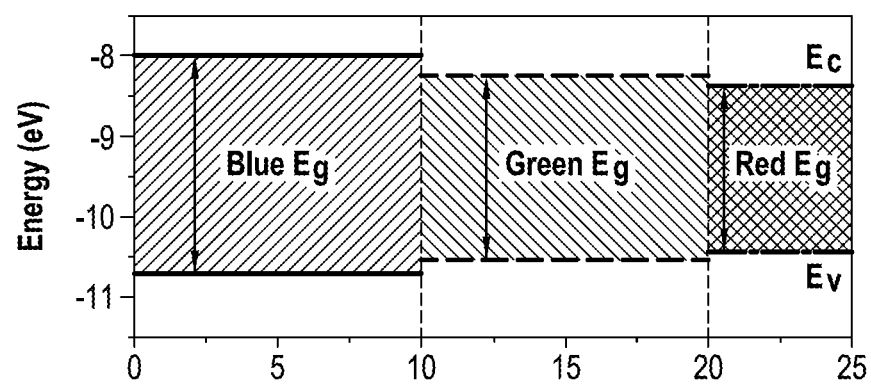
FIG. 12 illustrates a band lineup and refractive index profile of an exemplary three-segment nanosheet semiconductor device.

Turning ahead in the drawings, FIG. 12 illustrates a band lineup and refractive index profile of the three-segment nanosheet semiconductor device. The band alignment at both interfaces (left (blue)-center (green), center (green)- right (red)) are type I. The direct consequence of band edge alignment across hetero-interfaces is the carrier confinement or redistribution, since carriers diffuse to locations with the lowest energy. In the red-emitting segment, carriers are confined in the interfacial region. For the blue-emitting segment, carrier confinement near the interface is poor due to the existence of the lower bandgap material next to it (i.e., the green emitting region). Based on measurements of a zinc-sulfur-selenium (ZnSSe) ternary alloy thin film material using Equation 5:

$$\Gamma_m = \frac{2\varepsilon_0 c n_b \iint dxdy |E|^2}{\iint dxdy [E \times H^* + E^* \times H]}, \quad (5)$$

the estimated diffusion length of blue emitting material can be shown to be less than 1 micrometer, which can be much smaller than the full width of the segment (i.e., a few microns) and which can indicate a minor issue with carrier diffusion or poor confinement. The green-emitting segment has at least partial carrier confinement at the interface with the blue segment, and also has a typical width much larger than the diffusion length. Therefore, carrier diffusion away to the red emitting region can be a trivial concern.

Figure 13:
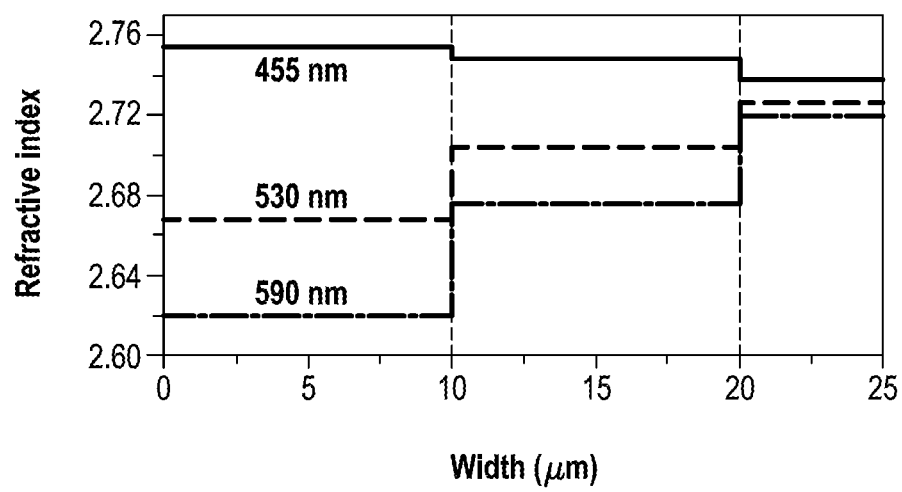
FIG. 13 illustrates a plot of the calculated indices of refraction for each segment of the exemplary three-segment nanosheet semiconductor device.

Meanwhile, turning ahead again in the drawings, FIG. 13 illustrates a plot of the calculated indices of refraction for each segment of the three-segment nanosheet semiconductor device. As shown by FIG. 13, the blue and red wavelengths (i.e., the top and bottom curves) have their highest refractive indices in their respective emission regions (left and right segments, respectively). Such index profiles can favor the confinement of blue and red light in the left and right segments. The green wavelength (center) at 530 nm is, however, has its highest refractive index in the red emitting segment (i.e., the right segment). Thus, it can be helpful to know if and how well the green light is confined in the middle segment.

Figure 14:
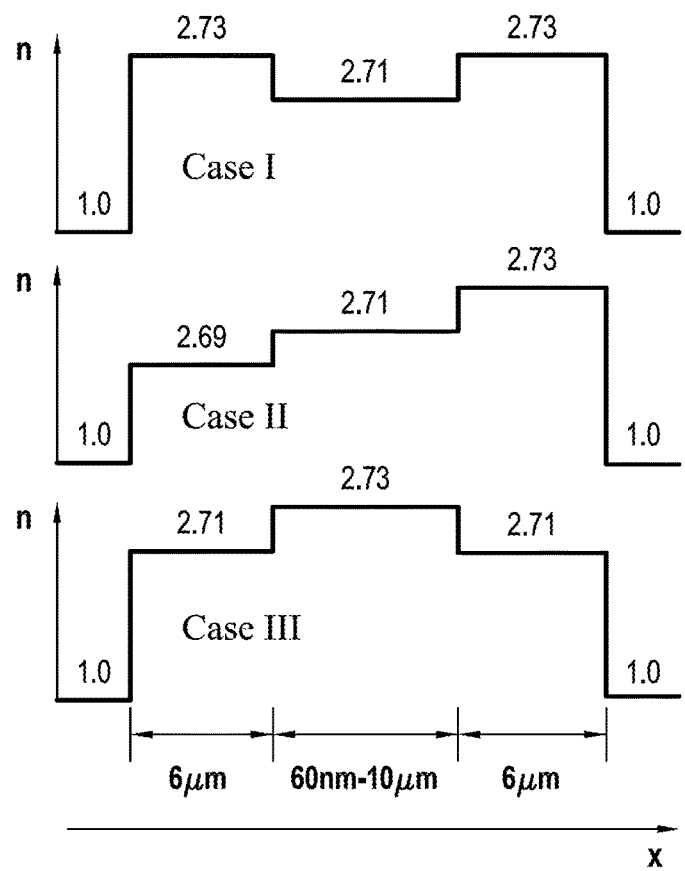
FIG. 14 illustrates a plot simulating the indices of refraction for three cases of wave guiding structures.

Turning ahead again in the drawings, considering waveguiding in more general terms, FIG. 14 illustrates a plot simulating the indices of refraction for three cases of wave guiding structures similar or identical to the three-segment nanosheet semiconductor device discussed above with respect to FIGS. 12 and 13. The widths of the two side segments (cladding layers of a waveguide) are fixed and the width of middle segment is varied from 0.2 micrometer to 10 micrometers. The top profile (Case I) is typically known as an anti-guiding waveguide where the index is lower in the core of the waveguide. The bottom profile (Case III) corresponds to a standard waveguide design. Meanwhile, the center profile (Case II) is an intermediate situation corresponding most closely to the three-segment nanosheet semiconductor device discussed above with respect to FIGS. 12 and 13 for the green mode. Consider the problem where the modes are confined in the x and y direction and propagate into the paper plane (z direction). For laser cavities, the gain confinement factor can describe how a mode is amplified by the optical gain in the gain (core) layer of a waveguide. The confinement factor in the core (middle segment) of the waveguide using Equation 6:

$$k = \frac{\lambda}{4\pi} \cdot \alpha, \quad (6)$$

where $\alpha$ is the absorption or gain coefficient and $\lambda$ is the vacuum wavelength.

Figure 16:
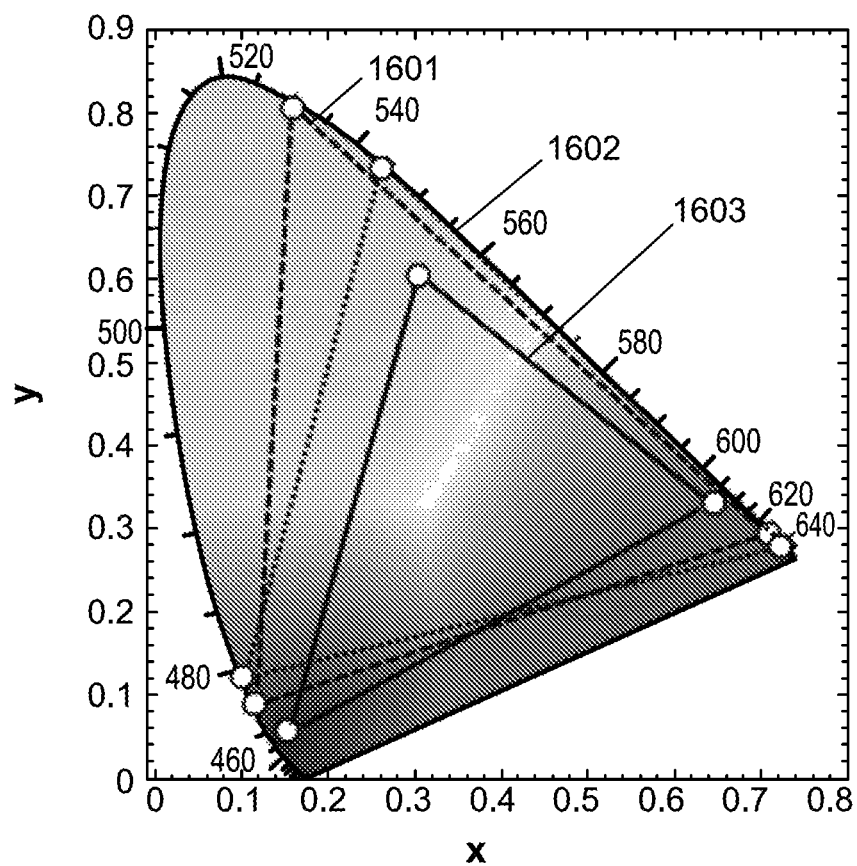
FIG. 16. illustrates a comparison of a first color gamut generated by a first semiconductor device and a second color gamut generated by a second semiconductor device with a standard sRGB color gamut.

Turning ahead again in the drawings, FIGS. 15 & 16 illustrate the calculated values of the confinement factor for the three cases of FIG. 14. The top curves of FIGS. 15 & 16, which corresponding to the bottom profile (Case III) of FIG. 14, show the confinement factor approaches 1 when the core layer is very wide and decreases to a still quite large value (approximately 0.8) even when the core width is down to a half-micron. Meanwhile, for the bottom curves, which correspond to the top profile (Case I) of FIG. 14, and the middle curves, which correspond to the center profile (Case II) of FIG. 14, the confinement factor for also approaches 1 when the width of the middle segment is very large (approximately 10 microns), even though the middle section in these two cases does not have the largest index of refraction. This relationship exists because the degree of confinement of the modes in the middle segment is mostly determined by the reflectivities at the two interfaces in the case of large width, where propagational character dominates over refractive character. The reflection coefficient depends mainly on the difference the indices of refraction on both sides of the interface. Therefore, the modes can still be well confined in the middle segment for the top profile (Case I) of FIG. 14 and the center profile (Case II) of FIG. 14, despite not always having the largest index of refraction among the three segments. But as the width of the middle segment decreases, the confinement factor drops more rapidly for the top profile (Case I) of FIG. 14 and the center profile (Case II) of FIG. 14 than for the bottom profile (Case III) of FIG. 14. At around 1 micron width, the confinement factor decreases to a quite small value around 0.15 for the top profile (Case I) of FIG. 14 and the center profile (Case II) of FIG. 14, but it remains as large 0.9 for the bottom profile (Case III) of FIG. 14. In the case of narrow width, the refraction character dominates. That is the regime where a standard waveguide, such as for the bottom profile (Case III) of FIG. 14, confines waves in the middle segment, while anti-guided or half anti-guided structures are poor waveguides. Accordingly, in some embodiments, such as, for example, when semiconductor device portion 302 (FIG. 3) is configured to emit green light, the waveguiding capability of semiconductor device portion 302 (FIG. 3) can be improved by increasing its width.

Considering again the three-segment nanosheet semiconductor device discussed with respect to FIGS. 12 & 13, in addition to confinement of optical modes through refractive index profile, optical modes can also be confined by intentionally creating spatial profile (or variation) of optical gain and/or absorption, where optical modes can be preferentially amplified or attenuated in differential spatial regions. Such confinement structure through gain or absorption profile is often called gain or absorption guided structure. As shown at FIG. 12, modes of blue and green wavelengths can be absorbed by the neighboring narrow bandgap segments near the interface regions. Such absorption can limit the spread of these modes into the neighboring regions and provide additional confinement mechanism. In addition, modes in each of the three segments can be amplified by the corresponding optical gain in their respective segments. To determine the modes of confinement through such gain and absorption profiles, the absorption coefficients for each of the three materials can be determined.

To this end, the absorption or gain coefficients can be calculated for the three quaternaries between 400 nm and 700 nm using a free-carrier model by assuming that interband transition is the dominant mechanism at room temperature and neglecting all other absorption mechanisms. Bandgap energy ($E_g$), spin-orbit splitting ($\Delta_0$), and effective mass of electrons ($m_e$) and holes ($m_{hh}$) in different segments (shown at Table 1) can be interpolated by Vegard's law with negligible bowing parameters.

TABLE 1

|  | $E_g$ (eV) | $\Delta_0$ (eV) | $m_e/m_0$ | $m_{hh}/m_0$ |
|---|---|---|---|---|
| *Band structure parameters of binary alloys | | | | |
| h-ZnS | 3.77 | 0.088 | 0.28 | 0.49 |
| h-ZnSe | 2.83 | 0.478 | 0.21 | 0.6 |
| h-CdS | 2.49 | 0.063 | 0.23 | 0.7 |
| h-CdSe | 1.76 | 0.405 | 0.12 | 0.45 |
| Band structure parameters of interpolated quaternary alloy | | | | |
| $Zn_{0.7}Cd_{0.3}S_{0.3}Se_{0.7}$ | 2.6949 | 0.3604 | 0.2011 | 0.5527 |
| $Zn_{0.4}Cd_{0.6}S_{0.15}Se_{0.85}$ | 2.3101 | 0.38 | 0.1701 | 0.5259 |
| $Zn_{0.25}Cd_{0.75}S_{0.05}Se_{0.95}$ | 2.0573 | 0.4070 | 0.1466 | 0.494 |

The intrinsic carrier density for the absorption calculation can be assumed to be less than $10^{17}$ cm$^{-3}$. The carrier density for the gain calculation can be assumed to be $10^{19}$ cm$^{-3}$, corresponding to a high level injection. The calculated absorption and gain coefficients of the three segments at their respective emission peak wavelengths are shown in Table 2, where the positive (negative) values represent gain (absorption) coefficients at different wavelengths.

TABLE 2

|  | 455 nm | 530 nm | 590 nm |
|---|---|---|---|
| $Zn_{0.7}Cd_{0.3}S_{0.3}Se_{0.7}$ | 2835 cm$^{-1}$ | — | — |
| $Zn_{0.4}Cd_{0.6}S_{0.15}Se_{0.85}$ | −23692 cm$^{-1}$ | 3353 cm$^{-1}$ | — |
| $Zn_{0.25}Cd_{0.75}S_{0.05}Se_{0.95}$ | −26462 cm$^{-1}$ | −20034 cm$^{-1}$ | 4210 cm$^{-1}$ |

According to Table 2, the red-emitting segment has the highest, and the blue-emitting segment has the lowest, material gain for the relevant emission wavelengths among all three segments, if equal pumping levels are assumed.

It can be shown through simulation that distinct modes of blue, green and red colored light can be confined in the left, middle, and right segment of the three-segment nanosheet semiconductor device discussed with respect to FIGS. 12 & 13, respectively, through the combined effects of index, gain, and absorption guiding. The refractive index profile alone can serve as a good waveguiding mechanism, the additional gain/absorption guiding improving the wave confinement of the three-segment nanosheet semiconductor device even further. To demonstrate such combined waveguiding effects more quantitatively, a two-dimensional simulation in the cross sectional plane of the three-segment nanosheet semiconductor device can be performed using computational finite element analysis. The three-segment nanosheet semiconductor device can have a thickness of approximately 200 nanometers and a length of approximately 30 micrometers. The blue and green segments, emitting at approximately 455 nanometers and approximately 530 nanometers respectively, each can be approximately 10 micrometers wide, and the red segment, emitting at 5 approximately 90 nanometers, can be approximately 5 micrometers wide. For the simulation, a complex index of refraction can be used. The imaginary part of the refractive index (k), also known as extinction coefficient, is related to the absorption or gain coefficient through Equation 6 (above). The refractive index (k) can be negative when it is absorption and positive when it is gain. Table 3 summarizes the calculated complex indices of the three-segment nanosheet semiconductor device for three different wavelengths.

TABLE 3

| Wavelength | Blue segment | Green segment | Red segment |
|---|---|---|---|
| 455 nm | 2.754 + 0.01i | 2.748 − 0.086i | 2.738 − 0.096i |
| 530 nm | 2.669 | 2.705 + 0.014i | 2.726 − 0.085i |
| 590 nm | 2.620 | 2.676 | 2.719 + 0.02i |

The three wavelengths all have optical gain in one of the segments, indicated by positive values of the refractive index (k), and the two shorter wavelengths can be absorbed in segments with longer emission wavelengths, indicated by negative values of the refractive index (k).

Based on the simulation results, the mode distribution is shown to reveal good confinement of modes of all three wavelengths in their respective segments. The green modes at 530 nanometers can show a strong optical confinement, consistent with the general waveguide analysis, despite the larger refractive index in the red-emitting segment than that of the green-emitting segment. To further investigate the influence of index or gain guiding to the lasing threshold, the modal loss (material loss times the confinement factor) of the green mode at 530 nanometers can be calculated as a function of the width of the green-emitting segment with different refractive indices (k) of the red segment at 2.6, 2.75 and 2.9. The modal loss can reach a maximum when the index of the red segment ($n_r$=2.75) is close to that of the green segment ($n_g$=2.705). When the index of red segment is lower than that of the green segment ($n_r$=2.6<$n_g$), less energy leaks into the absorbing red segment due to the index guiding, and therefore the modal loss is lower. When the index of the red segment is higher than that of the green segment ($n_r$=2.9>$n_g$), the modal loss is also slightly lower than the case that $n_r$ equals 2.75, due to the higher index contrast. The modal loss can decrease dramatically as the width of green segment increases. When the width of the green segment is larger than 2 micrometers, the difference of modal loss among all three cases is not noticeable. Since the actual width of the green segment of the three-segment nanosheet semiconductor device can be larger than approximately 10 micrometers, the modal loss in all three cases can be quite low, and thus the lasing thresholds would not have dramatic differences.

To further investigate the impact of segment width, a threshold gain of the fundamental mode as the function of segment width for blue emission at approximately 455 nanometers and green emission at approximately 530 nm can be investigated. The threshold gain can include the contribution of propagation loss due to the existence of neighboring narrow gap segments and the facet transmission loss at the end of the three-segment nanosheet semiconductor device, which can be estimated using Fresnel's equations and the effective refractive index difference between the three-segment nanosheet semiconductor device and air, as well as the influence of modal confinement factor, which has been defined in Equation 5 (above). The threshold can increase as the width of the wide bandgap segments decreases. Therefore, in many embodiments, when semiconductor device portion 301 (FIG. 3) and semiconductor device portion 302 (FIG. 3) are configured to emit blue and green light, respectively, growing semiconductor device portion 301 (FIG. 3) and semiconductor device portion 302 (FIG. 3) wide enough to overcome absorption loss in semiconductor device portion 303 (FIG. 3) can provide for better results. In general, for segments narrower than 0.8 micrometer, the threshold is dominated by absorption loss in the neighboring narrow gap segment and rapidly increases, indicating that such wide-gap segments may be unable to lase if they are too narrow.

The understanding that wide-gap segments may be unable to lase if they are too narrow validates the earlier discussed concept that high aspect ratio segments may not be suitable for multi-color lasing. As the width increases from 1 to several microns, the absorption in the neighboring narrow-gap segment can drop exponentially with the width. The main contribution to the threshold gain can then be determined by the transmission loss at the two end facets of the three-segment nanosheet semiconductor device. The required threshold gain decreases to several hundred $cm^{-1}$, compared to >1000 $cm^{-1}$ material gain for a typical bulk semiconductor, low enough for lasing at short wavelengths. Accordingly, in many embodiments, even a judicious choice of materials for the segments of the three-segment nanosheet semiconductor device may be insufficient to ensure lasing without a proper consideration of the shape, size, and arrangement of various segments in the three-segment nanosheet semiconductor device.

Turning now back to FIG. 3, in many embodiments, semiconductor device 300 can improve upon previous semiconductor device structures configured to emit light in two primary colors (e.g., red and green) of the visible color spectrum, including a two-segment cadmium-sulfur-selenium (CdSSe) ternary alloy nanosheet and a nanowire with a looped end. That is, using method 100 (FIG. 1) to manufacture semiconductor device 300 can permit a third segment configured to emit blue light (e.g., semiconductor device portion 301) to be monolithically integrated with segments configured to emit green light (e.g., semiconductor device portion 302) and red light (e.g., semiconductor device portion 303). Rather than attempting to directly grow a semiconductor device portion rich in zinc and sulfur next to semiconductor device portions rich in cadmium and sulfur and in cadmium and selenium, method 100 (FIG. 1) permits a semiconductor device portion rich in cadmium selenide to be transformed into a semiconductor device portion rich in zinc and sulfur before semiconductor device portions rich in cadmium and sulfur and in cadmium and selenium are grown.

Figure 4:
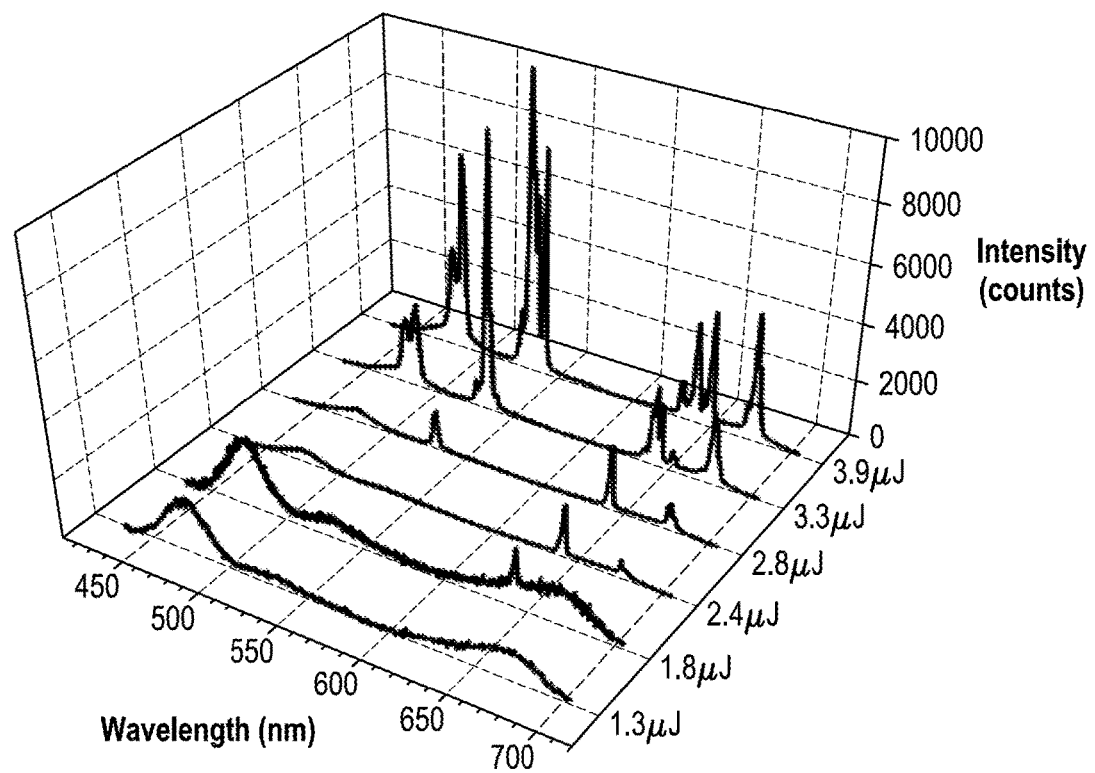
FIG. 4 illustrates a spectral evolution of an exemplary semiconductor device when the semiconductor device is excited by a 355 nanometer pulsed laser having a pulse width of 9 nanoseconds.

Turning ahead in the drawings, FIG. 4 illustrates a spectral evolution of an exemplary semiconductor device when the semiconductor device is excited by a 355 nanometer pulsed laser having a pulse width of 9 nanoseconds. The spectral evolution is plotted with spectral intensity (counts) being a function of wavelength (nanometers) and energy (microjoules). In many embodiments, the semiconductor device can be similar or identical to semiconductor device 300 (FIG. 3).

At the lowest pumping energy of 1.3 microjoules, only broadband spontaneous emission is observed. Increasing the pumping energy from 1.8 microjoules to 3.3 microjoules, narrow peaks at red (642 nanometers and 675 nanometers), green (530 nanometers) and blue (484 nanometers) colors appear sequentially. Both the intensity and the number of peaks of each color increase with pumping energy, which is attributed to multimode lasing behavior. A lasing wavelength span of 191 nanometers can be seen, which is far beyond the gain bandwidth of any reported monolithic semiconductor. The light-red lasing (642 nanometers) was generated from a cation-terminated growth front. The deep-red lasing (675 nanometers) was from an anion terminated growth front on the opposite side of semiconductor device 400. Due to the large size of semiconductor device 400, different longitudinal and transverse modes can cause very close mode spacing, and thus more modes are excited above the threshold with the increase in pumping intensity. At a pumping level of 3.9 microjoules, multimode lasing can be clearly observed. High resolution photoluminescence measurements reveal that the linewidth of each individual mode narrows down to approximately 0.4 nanometer once pumped above the lasing threshold.

Figure 5:
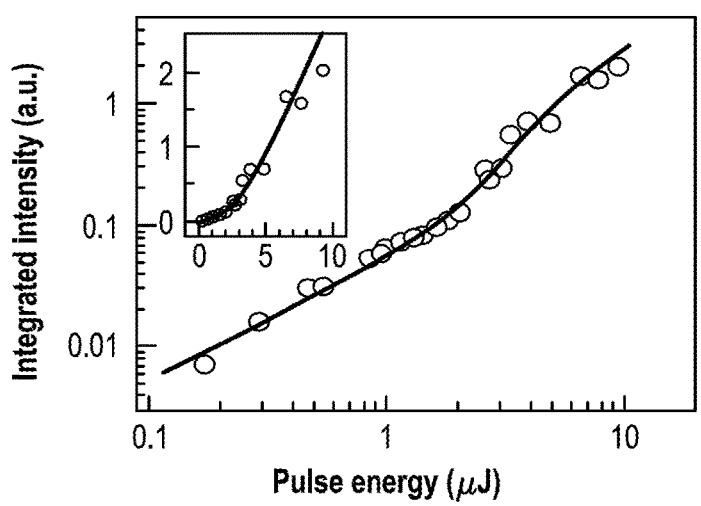
FIG. 5 illustrates a light-in-light-out (LILO) curve of a 484 nanometer lasing peak emitted by the exemplary semiconductor device of FIG. 4.
Figure 6:
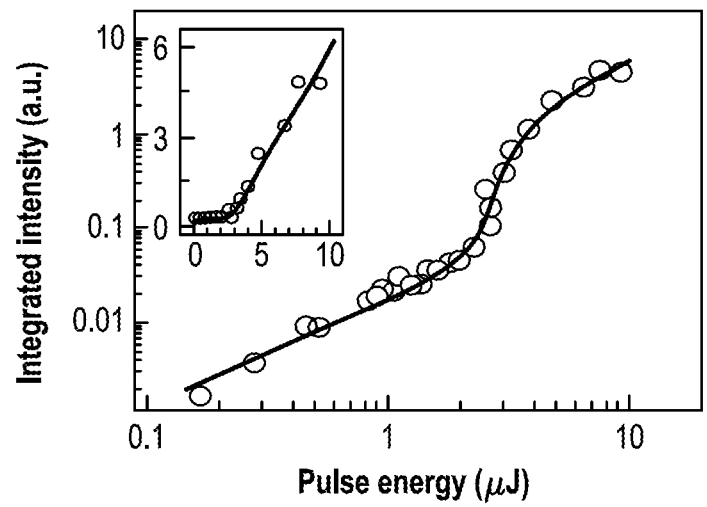
FIG. 6 illustrates a light-in-light-out (LILO) curve of a 530 nanometer lasing peak emitted by the exemplary semiconductor device of FIG. 4.
Figure 7:
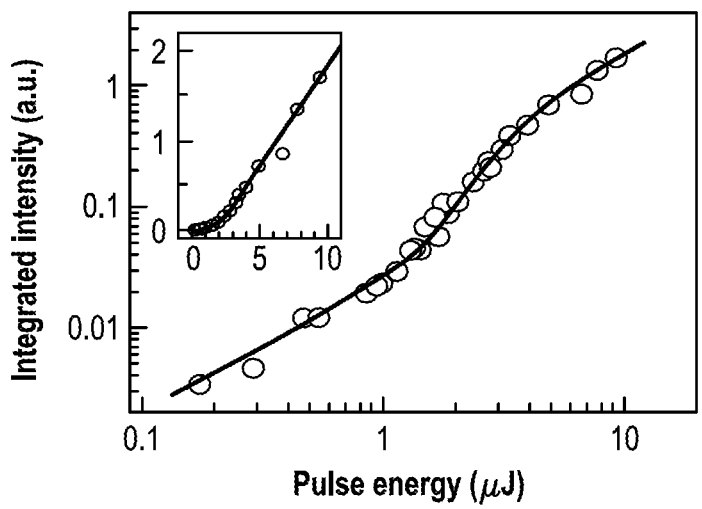
FIG. 7 illustrates a light-in-light-out (LILO) curve of a 642 nanometer lasing peak emitted by the exemplary semiconductor device of FIG. 4.
Figure 8:
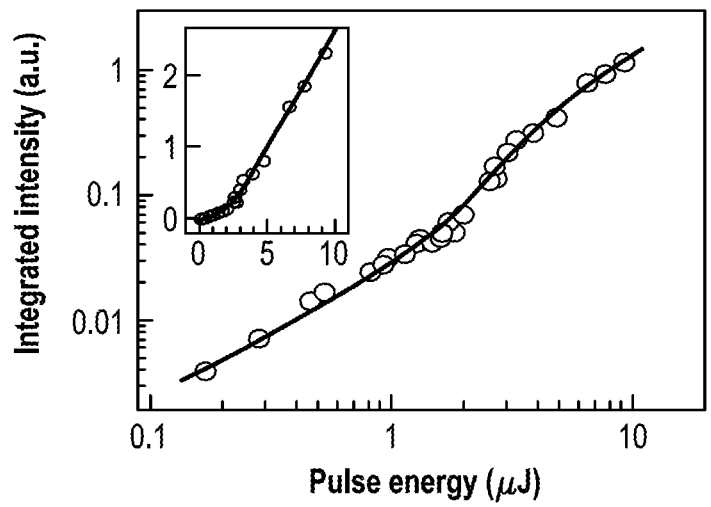
FIG. 8 illustrates a light-in-light-out (LILO) curve of a 675 nanometer lasing peak emitted by the exemplary semiconductor device of FIG. 4.

Turning ahead again in the drawings, FIGS. 5-8 illustrate light-in-light-out (LILO) curves of an exemplary semiconductor device, together with theoretical fittings based on multimode lasing equations. The exemplary semiconductor device 300 (FIG. 3) and/or the semiconductor device described above with respect to FIG. 4. The LILO curves illustrate the integrated intensity of the exemplary semiconductor device in arbitrary units as a function of pulse energy in microjoules. Specifically, FIG. 5 illustrates a light-in-light-out (LILO) curve of a 484 nanometer lasing peak emitted by the exemplary semiconductor device; FIG. 6 illustrates a light-in-light-out (LILO) curve of a 530 nanometer lasing peak emitted by the exemplary semiconductor device; FIG. 7 illustrates a light-in-light-out (LILO) curve of a 642 nanometer lasing peak emitted by the exemplary semiconductor device; and FIG. 8 illustrates a light-in-light-out (LILO) curve of a 675 nanometer lasing peak emitted by the exemplary semiconductor device.

FIGS. 5-8 show further evidence of multi-color lasing behavior. Typical S-like curves covering the three regimes of operation are clear in the double log scale plots. For all four colors both the spontaneous emission regime, dominating at lower pumping intensity, and the stimulated emission regime, dominating at higher pumping intensity, have slopes of approximately 1. The maximum slope of the superliner transition regime, in which amplified spontaneous emission is the dominant process, varies by color. The slopes are calculated to be approximately 2.1 at FIG. 5, 7.3 at FIG. 6, 2.7 at FIG. 7 and 2.2 at FIG. 8. Since the maximum slope of the superliner regime represents the most dramatic transition from spontaneous emission to lasing, they are often used to define the lasing threshold. Based on FIGS. 5-8, the thresholds for blue, green, light red, and deep red lasing are 3.3 microjoules at FIG. 5, 2.9 microjoules at FIG. 6, 2.0 microjoules at FIG. 7, and 3.0 microjoules, respectively, for single pulse excitation, corresponding to the power density of 1441 kilowatts per square centimeters at FIG. 5, 1266 kilowatts per square centimeters at FIG. 6, 873 kilowatts per square centimeters at FIG. 7, and 1310 kilowatts per square centimeters at FIG. 8.

Turning now back to FIG. 3, in some embodiments, semiconductor device 300 can be dynamically tuned to emit various colors over the full-color range at room temperature, such as, for example, to permit white color lasing. Three beams can be pumped into semiconductor 300 to pump first semiconductor device portion 301, second semiconductor device portion 302, and third semiconductor device portion 303. The power of each pumping beam can be independently adjusted to allow for precise, independent tuning of the lasing intensity of each color. As a result, the mixed lasing colors in the far field can be controllably varied in the full-color range and the desired white color can be achieved. By pumping one, two and all three of first semiconductor device portion 301, second semiconductor device portion 302, and third semiconductor device portion 303 above their lasing thresholds, simultaneous lasing of any one, two, or three of the three primary colors can be provided.

In some embodiments, semiconductor device 300 can be uniformly pumped. A source beam from a neodymium-doped yttrium aluminium garnet (Nd:YAG) laser can be directed through a convex lens and then pumped onto semiconductor device 300. The pumping beam can be defocused to enlarge the beam size and create more uniform pumping across semiconductor device 300.

In other embodiments, in order to exercise control over the pumping power delivered to each of first semiconductor device portion 301, second semiconductor device portion 302, and third semiconductor device portion 303, three laser beams can be generated with independently controlled intensity and beam shape. For example, a neodymium-doped yttrium aluminium garnet (Nd:YAG) laser can be directed through one concave cylindrical lens (CL1) and one convex cylindrical lens (CL2). The length-to-width ratio of the laser beam after the set of cylindrical lenses can be adjustable based on the distance between CL1 and CL2. Two beam splitters (BS1 and BS2) can be used to split the source beam and create three separate beams, allowing the intensity of each beam to be independently adjusted. Two additional beam splitters (BS3 and BS4) can then be used to recombine the three beams, and a spherical lens (L2) can be used to focus the combined beam onto semiconductor device 300. Alignment of each beam relative to first semiconductor device portion 301, second semiconductor device portion 302, and third semiconductor device portion 303 can be performed by adjusting the reflection angles of BS3 and BS4 and various mirrors used to direct the laser beams.

Figure 9:
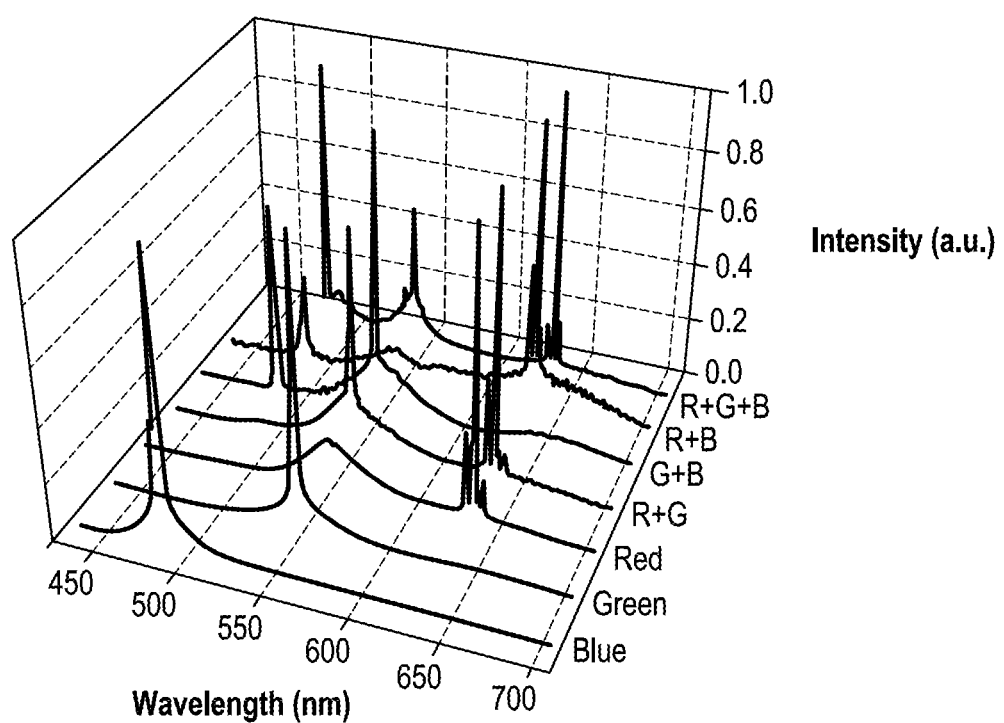
FIG. 9 illustrates emission spectra for an exemplary semiconductor device showing each potential combination of the three primary colors.

Turning ahead in the drawings, FIG. 9 illustrates emission spectra for an exemplary semiconductor device showing each potential combination of the three primary colors. The exemplary semiconductor device can be similar or identical to semiconductor device 300 (FIG. 3).

Figure 10:
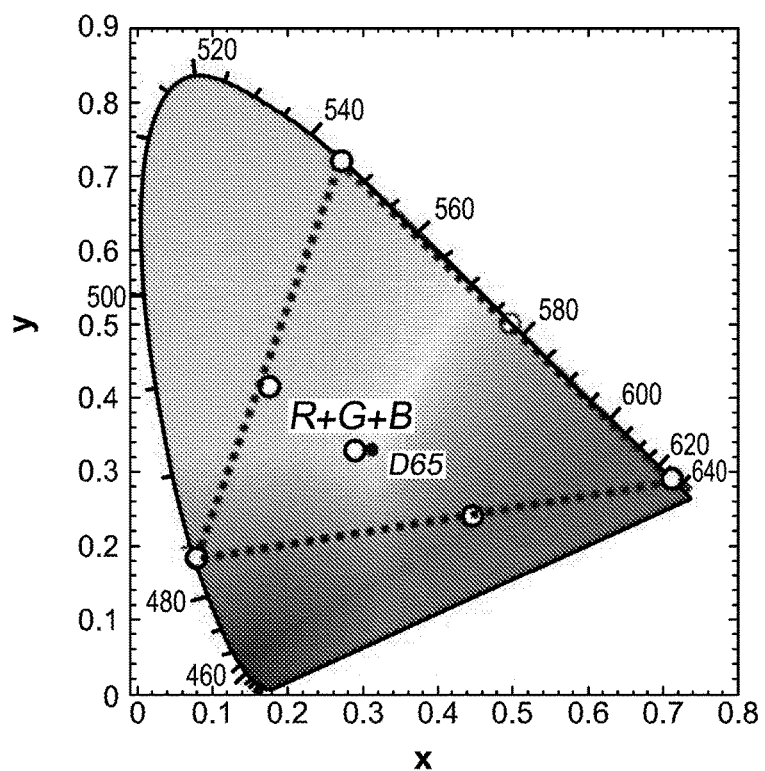
FIG. 10 illustrates a chromaticity of the semiconductor device relating to FIG. 9 on the CIE1931 color diagram based on the emission spectra of FIG. 9.

Meanwhile, turning ahead again in the drawings, FIG. 10 illustrates a chromaticity of the semiconductor device relating to FIG. 9 on the CIE1931 color diagram based on the emission spectra of FIG. 9. The chromaticity of the carefully balanced white lasing is very close to that of the white point CIE standard white illuminant D6547 (shown at FIG. 10). In addition, according to the Grassmann law, all colors inside the triangle formed by the three elementary colors can be realized through proper mixing of three colors. Accordingly, the semiconductor device discussed with respect to FIGS. 9 & 10 can cover seventy percent more perceptible colors than the industry standard sRGB48 color gamut after converting to a perceptually uniform color space.

To calculate the chromaticity of color mixing of the semiconductor device, the lasing wavelengths and intensities of each laser line can be determined. Certain spectral features of spontaneous emission may be recorded when the spectral collection direction is normal to the surface of the semiconductor device, which may have a maximum spontaneous emission collection efficiency but a minimum stimulated emission collection efficiency. To study the chromaticity of the lasing, the contribution from spontaneous emission can be removed and the pure lasing spectral features can be extracted from the overall spectra. Multi-peak Lorentzian fitting can be used to extract both the lasing peak intensity and the broadband spontaneous emission intensity. By removing the background contribution of spontaneous emission, the relative intensity ratio of different lasing peaks can be more accurately calculated to determine the combined color due solely to lasing contributions.

The extracted lasing spectra can then be used to calculate the chromaticity point on the CIE 1931 color diagram. Equations 7-9 can be used to determine the tristimulus values for the lasing color:

$$X = \int_{380}^{780} I(\lambda)\bar{x}(\lambda)d\lambda, \tag{7}$$

$$Y = \int_{380}^{780} I(\lambda)\bar{y}(\lambda)d\lambda, \text{and} \tag{8}$$

$$Z = \int_{380}^{780} I(\lambda)\bar{z}(\lambda)d\lambda, \tag{9}$$

where $I(\lambda)$ is the extracted lasing spectra and $\bar{x}(\lambda)$, $\bar{y}(\lambda)$, and $\bar{z}(\lambda)$ are the color matching function. Meanwhile, the chromaticity point of the lasing color can be specified with x and y coordinates on the diagram by simply using Equations 10 and 11:

$$x = \frac{X}{X+Y+Z} \tag{10}$$

$$y = \frac{Y}{X+Y+Z}. \tag{11}$$

In general, red-green-blue lasers can permit a larger color gamut, higher contrast ratio, better color saturation, and more vivid colors than light emitting diodes due to the narrow linewidth of the stimulated emission. The color from a single wavelength source such as a laser, which is at the edges of the CIE map, can be in full saturation or the most vivid. In contrast, colors of broadband sources with wide spectral widths (such as those from light emitting diodes or thermal sources) can be away from the pure colors, thereby being less saturated or less vivid. Meanwhile, the saturation contrast of a laser display can be higher than the contrast of broadband sources. As a result, colors generated by combining three laser sources with narrow spectral lines can have more vivid colors than colors generated by broadband light sources.

Turning ahead in the drawings, FIG. 16. illustrates a comparison of first color gamut 1601 generated by a first semiconductor device and second color gamut 1602 generated by a second semiconductor device with the standard sRGB color gamut 1603, which is widely used in industry. The first semiconductor device and the second semiconductor device each can be similar to semiconductor device 300 (FIG. 3).

Referring now back to FIG. 1, as noted above, semiconductor devices provided (e.g., manufactured) by method 100 can depend on the vapor-liquid-solid (VLS) growth mechanisms and vapor-solid (VS) growth mechanisms that occur when performing method 100 and/or one or more of activities 201-204 (FIG. 2). Accordingly, understanding these growth mechanisms can be helpful when performing method 100 and/or one or more of activities 201-204 (FIG. 2).

In many embodiments, initially, axial nanowire growth can take place along the [010] direction via gold-catalyzed a vapor-liquid-solid (VLS) growth mechanism as the reaction chamber heats up due to low vapor pressure. At a certain stage during the temperature ramp-up, the vapor-liquid-solid (VLS) growth mechanism along the initial axis and a vapor-solid (VS) growth mechanism from the side can occur simultaneously, leading to a tapered triangular shape. Subsequently, predominantly lateral growth (through self-catalyzed vapor-liquid-solid (VLS) and/or vapor-solid (VS)) can occur along the [001] direction when the vapor pressure increases as a source temperature is ramped up and after the reaction chamber has reached a target temperature. Meanwhile, during the vapor-solid (VS) deposition on the sides of structures, the spontaneous formation of native metal-particles (cadmium or zinc) can lead to secondary vapor-liquid-solid (VLS) growth of nanowires along [001] direction. The subsequent vapor-solid (VS) growth on the sides of these secondary wires can fill the gaps between those wires. The imperfect filling of those gaps can be sometimes visible at the edges of the nanosheets. The sideward growth can occur in the [001] and [00$\bar{1}$] directions on the two corresponding polar surfaces of a nanosheet, leading to a nanosheet structure of relatively small length-width aspect ratio. The vapor-solid (VS) growth in the second phase occurs at high vapor pressure with high level of supersaturation. For binary precursor materials of cadmium selenide (CdSe) and zinc sulfide (ZnS), a vapor-solid (VS) growth may be most likely to occur in the cadmium selenide (CdSe) or in a zinc-cadmium-sulfur-selenium (ZnCdSSe) quaternary alloy with composition close to cadmium selenide (CdSe). For the quaternary alloy with compositions close to zinc sulfide (ZnS) or zinc selenide (ZnSe), the low vapor pressure can make a vapor-solid (VS) growth mechanism unlikely to occur. Lateral growth can be asymmetric with respect to the growth along [001] and [00$\bar{1}$] directions. This can lead to segments with different widths on the two opposite sides of the blue light emitting segment, which can be attributed to the chemical activity differences between the two polar facets along the [001] and [00$\bar{1}$] directions. When the surface is terminated by cations ($Zn^{2+}$ or $Cd^{2+}$), it can have a higher surface energy, and thus can be more reactive.

A catalytic process by zinc (Zn) and cadmium (Cd) atoms could also potentially increase the growth tendency from the cation side, which can result in a much higher growth rate along the cation-terminated edge than along the anion-terminated edge. Depending on the growth times, the segments on the anion terminated side may be very narrow, or even non-existent. If the growth time for the red light emitting segment is longer than that for the greenlight emitting segment, the anion-terminated side may have only one narrow segment while the cation-terminated side may have two wide segments of different compositions. The wavelengths of the emitted light from the narrow and wide regions of similar colors can vary by several nanometers even though all segments were grown under the same conditions and at the same time, resulting in the presence of four distinct emission peaks from some structures instead of the expected three. The four distinct emission peaks may be due to the higher interdiffusion rate along the positively charged polar growth front. The four distinct emission peaks may be observed for cadmium and selenium rich regions of a zinc-cadmium-sulfur-selenium (ZnCdSSe) quaternary alloy, resulting in different emission wavelengths in red colors.

Accordingly, the growth direction of initial vapor-liquid-solid (VLS) nanowires can be the deciding factor for the eventual growth of nanowires (including high aspect ratio nanobelts) vs. low aspect ratio nanosheets. If the initial vapor-liquid-solid (VLS) nanowire growth is along [001] direction, subsequent growths may continue predominantly along [001] direction, leading to high aspect ratio wires or belts. On the contrary, if the initial vapor-liquid-solid (VLS) growth is along a direction orthogonal to [001] direction, subsequent growth at higher supersaturation predominantly along [001] or [00-1] direction can lead to low aspect ratio nanosheet structures. What determines the initial vapor-liquid-solid (VLS) growth directions may be material dependent. For materials such as gallium nitride (GaN), zinc sulfide (ZnS), and zinc selenide (ZnSe), the initial growth direction may be [001], while for materials such as cadmium selenide (CdSe) the initial growth direction may be vertical to [001]. Materials such as cadmium sulfide (CdS) can be grown in either mode. This explains why certain materials are grown typically into nanowires or nanobelts vs. nanosheets.

Therefore, understanding these growth mechanisms can be explored to control the size and geometry of nanosheet structures. For example, under method 100, the size and geometry of semiconductor devices and segments provided (e.g., manufactured) can be controlled. Length can depend on temperature ramp-up time because the growth along [010] direction may occurs only for a short period of time in this stage. After this initial time, and after temperature reaches a target value, growth may occur predominantly along the [001] direction such that the width of semiconductor devices and segments provided (e.g., manufactured) by method 100 can depend on the time over which each device material is formed. Thickness can be determined by the size of the initial nanowires grown, which in turn can be determined by the size of gold nanoparticles implemented.

Referring again to FIG. 3, due to the vapor-liquid-solid (VLS) and vapor-solid (VS) growth mechanisms described above, semiconductor device 300 can have rough surfaces. Such rough surfaces may lead to scattering loss. Tapping mode atomic force microscopy (AFM) can be performed on semiconductor device 300 to generate a height line-scan of semiconductor device 300 in order to investigate the influence of this surface roughness on the laser cavity and Q factor. In many embodiments, the line scan direction can be along the [010] direction vertical to the vapor-solid growth direction [001]. Surface roughness information can be extracted from the full body scan. In many embodiments, the height fluctuation from maximum to minimum can be approximately 70 nm, which, in some embodiments, can be nearly 25-30 percent of the overall thickness of semiconductor device 300. Since this range of surface heights can be relatively large compared to the thickness of semiconductor device 300, the impact of the surface roughness on the Q factor of laser cavities formed by semiconductor 300 can be determined.

For example, a two-dimensional domain simulation can be performed to compare the difference of Q factors between rough and perfectly smooth surfaces. For the rough case, the bottom of the simulated semiconductor device can be assumed to be flat. For the smooth case, both the top and bottom surfaces can be assumed to be flat. For the rough case, the semiconductor device can be assumed to have an average thickness of approximately 230 nanometers, plus the measured height fluctuation, and for the smooth case, the thickness can be set to exactly 230 nm. A green wavelength range can be used to calculate the modes and the frequency response of the cavity. Although the mode patterns of the two cases are slightly different, the Q factors extracted from the frequency responses of the stored energy can have no dramatic difference (<17% of the Q factor differences). This result can be attributed to the relatively small change in thickness that occurs on a much larger spatial scale than the wavelength in medium. For example, the relative surface height-change within a wavelength can be approximately 4 percent. Such small and slowly spatially-varying thickness may not affect the Q-factor significantly. The Q factors in both cases can be large enough to allow lasing, and the rough surface only slightly decreases it.

In many embodiments, semiconductor device 300 can comprise a peak output power greater than or equal to approximately 121 microwatts and less than or equal to approximately 419 microwatts, and a calculated laser efficiency greater than or equal to approximately 0.9 percent and less than or equal to approximately 4.3 percent. Table 4 (below) shows exemplary peak output power and calculated laser efficiency values for semiconductor device 300. In further embodiments, semiconductor device 300 can have much larger output power than a nanowire structure (e.g., a cadmium sulfur (CdS) nanowire) due to the larger volume of semiconductor device 300 relative to a nanowire structure, indicating the potential of semiconductor device 300 in high power illumination applications.

facets and the length of semiconductor device 300. Table 5 (below) shows a comparison of the lasing threshold of a semiconductor device similar or identical to semiconductor device 300 (Device 1—Top) relative to various other nanostructures. The data was collected at room temperature except for Device 5 at 250 Kelvin and Device 11 at less than 10 Kelvin.

TABLE 5

| | | Dimensions | | | | Pumping Source | | |
|---|---|---|---|---|---|---|---|---|
| Material | Morphology | Length ($\mu$m) | Width ($\mu$m) | Thickness$^\$$ (nm) | Threshold (kW/cm$^2$) | Type | Wavelength | Pulse Width |
| ZnCdSSe | Nanosheet | 28 | 18 | 300 | 400-1400 | Nd:YAG | 355 nm | 9 ns |
| CdSe | Nanobelt | >10 | — | 100-800 | 100 | Nd:YAG | 355 nm | 6 ns |
| ZnO | Nanowire | 12.2 | — | 250 | 270 | Nd:YAG | 355 nm | 6 ns |
| ZnO | Nanowire | 15 | — | 150 | 150 | Nd:YAG | 355 nm | 5 ns |
| ZnO | Nanosheet | 15 | — | 150 | 50 | Nd:YAG | 355 nm | 5 ns |
| CdS | Nanowire | 30-50 | — | 150 | $10^4$ | Ti:Sapphire | 405 nm | 350 fs |
| CdS | Nanowire | 15 | — | 175 | 10 | Nd:YAG | 355 nm | 100 ns |
| ZnSe | Nanoribbon | >100 | 10 | 60-80 | 65 | Nd:YAG | 266 nm | — |
| CdSSe | Nanoribbon | 127 | — | 200 | $10^4$(Red) $6.8 \times 10^4$(Green) | Nd:YAG | 532 nm | 5 ns |
| ZnO | Nanowire | 4 | — | 120 | 350 | Ti:Sapphire | 310 nm | 200 fs |
| CdS | Nanowire | 8-43 | — | >200 | ~$10^4$ | Ti:Sapphire | 405 nm | 100 fs |
| CdSSe | Nanoribbon | 20 | 5 | 200 | 80(red) 200(green) | Nd:YAG | 355 nm | — |
| ZnO | Nanowire | 2-10 | — | 70-150 | 40 | Nd:YAG | 266 nm | 3 ns |
| GaN | Nanowire | 40 | — | 300 | $3.5 \times 10^3$ | Ti:Sapphire | 400 nm | 200 fs |
| CdS | Nanowire | ~30 | — | 50-200 | ~$10^5$ | Ti:Sapphire | 266 nm | — |
| ZnCdS | Nanribbon | >100 | 2-5 | 50-80 | 35-190 | Nd:YAG | 266 nm | 6 ns |
| CdSSe | Nanosheet | 66 | 33 | 200 | 200(red) 300(green) | Nd:YAG | 355 nm | 9 ns |

TABLE 4

| Peak Output Power | Efficiency |
|---|---|
| 310 mW | 1.2% |
| 121 mW | 0.9% |
| 387 mW | 4.3% |
| 419 mW | 1.7% |
| 224 mW | 3.2% |

In many embodiments, a lasing threshold of semiconductor device 300 can be greater than or equal to approximately 400 kilowatts per square centimeter and less than or equal to approximately 1400 kilowatts per square centimeter. In some embodiments, the lasing threshold can be larger at first semiconductor device portion 301 than in second semiconductor device portion 302 and third semiconductor device portion 303. The larger lasing threshold for first semiconductor device portion 301 can result from lower crystal quality, as a result of an imperfect double ion exchange mechanism and an absorption of blue wavelength light by narrower bandgap sections. For semiconductor device portion 302, the lasing threshold can be dependent on the width, due to the absorption of the emission by semiconductor device portion 303. In addition, the difference in the absorption coefficients of pump beams by segments of different bandgaps also increases the threshold of widegap segments, due to smaller absorption coefficients. In some embodiments, the lasing thresholds and whether semiconductor device 300 can lase can be sensitive to the quality of the end facets and the length of semiconductor device 300.

In some embodiments, the power stability of semiconductor device 300 can be close to that of commercial optical pumped solid state lasers. For example, in these or other embodiments, semiconductor laser 300 can have a decrease in lasing intensity of approximately 5 or less percent over 20 minutes of operation. Lifetime and durability of semiconductor device 300 can be improved with carefully designed thermal packaging and heat sinking.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the activities of method 100 (FIG. 1) and/or method 300 (FIG. 3) may be comprised of many different activities, be performed by many different modules, and in many different orders, that any element of FIGS. 1-16 may be modified, and that the foregoing discussion of certain of these embodiments does not necessarily represent a complete description of all possible embodiments.

Generally, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method comprising:
providing a carrier substrate;
forming a first device material over the carrier substrate; and
after forming the first device material over the carrier substrate, transforming the first device material into a second device material;
wherein:
   transforming the first device material into the second device material comprises:
      causing a cationic exchange in the first device material; and
      causing an anionic exchange in the first device material;
   and
   causing the cationic exchange in the first device material and causing the anionic exchange in the first device material occur approximately simultaneously.

2. The method of claim 1 further comprising:
exposing the carrier substrate to a first temperature;
wherein:
   exposing the carrier substrate to the first temperature and forming the first device material over the carrier substrate occur approximately simultaneously;
   transforming the first device material into the second device material further comprises:
      exposing the carrier substrate to a second temperature;
   and
   exposing the carrier substrate to the second temperature comprises:
      causing the cationic exchange in the first device material; and
      causing the anionic exchange in the first device material.

3. The method of claim 2 wherein:
the second temperature is greater than the first temperature.

4. The method of claim 2 further comprising:
depositing a first precursor material over the carrier substrate; and
depositing a second precursor material over the carrier substrate;
wherein:
   depositing the first precursor material over the carrier substrate and depositing the second precursor material over the carrier substrate comprise:
      forming the first device material over the carrier substrate.

5. The method of claim 4 further comprising:
positioning the carrier substrate a first distance from a source of the first precursor material and a second distance from a source of the second precursor material;
wherein:
   forming the first device material over the carrier substrate and positioning the carrier substrate the first distance from the source of the first precursor material and the second distance from the source of the second precursor material occur approximately simultaneously;
transforming the first device material into the second device material further comprises:
   positioning the carrier substrate a third distance from the source of the first precursor material and a fourth distance from the source of the second precursor material;
and
at least one of:
   positioning the carrier substrate the first distance from the source of the first precursor material and the second distance from the source of the second precursor material comprises:
      exposing the carrier substrate to the first temperature;
   or
   positioning the carrier substrate the third distance from the source of the first precursor material and the fourth distance from the source of the second precursor material comprises:
      exposing the carrier substrate to the second temperature.

6. The method of claim 5 wherein at least one of:
the second distance is less than the first distance; or
the fourth distance is less than the second distance.

7. The method of claim 4 wherein at least one of:
the first precursor material comprises cadmium selenide; or
the second precursor material comprises zinc sulfide.

8. The method of claim 1 further comprising:
after transforming the first device material into the second device material, forming a third device material over the carrier substrate.

9. The method of claim 8 further comprising:
after forming the third device material over the carrier substrate, forming a fourth device material over the carrier substrate.

10. The method of claim 1 wherein:
the first device material comprises a first quaternary alloy; and
the first quaternary alloy comprises a first alloy composition.

11. The method of claim 10 wherein at least one of:
the second device material comprises a second quaternary alloy, the second quaternary alloy comprises a second alloy composition, the first quaternary alloy comprises the second quaternary alloy, and the first alloy composition is different than the second alloy composition; or
the first quaternary alloy comprises a zinc-cadmium-sulfur-selenium (ZnCdSSe) quaternary alloy.

12. The method of claim 10 wherein at least one of:
(a) a third device material comprises a third quaternary alloy, the third quaternary alloy comprises a third alloy composition, the first quaternary alloy comprises the third quaternary alloy, and the first alloy composition is different than the third alloy composition; or
(b) a fourth device material comprises a fourth quaternary alloy, the fourth quaternary alloy comprises a fourth alloy composition, the first quaternary alloy comprises the fourth quaternary alloy, and the first alloy composition comprises the fourth alloy composition.

13. The method of claim 1 further comprising:
exposing the carrier substrate to a first temperature;
depositing a first precursor material over the carrier substrate;

depositing a second precursor material over the carrier substrate; and positioning the carrier substrate a first distance from a source of the first precursor material and a second distance from a source of the second precursor material;

wherein:
  exposing the carrier substrate to the first temperature and forming the first device material over the carrier substrate occur approximately simultaneously;
  transforming the first device material into the second device material further comprises:
    exposing the carrier substrate to a second temperature;
  exposing the carrier substrate to the second temperature comprises:
    causing the cationic exchange in the first device material; and
    causing the anionic exchange in the first device material;
  the second temperature is greater than the first temperature;
  depositing the first precursor material over the carrier substrate and depositing the second precursor material over the carrier substrate comprise:
    forming the first device material over the carrier substrate;
  forming the first device material over the carrier substrate and positioning the carrier substrate the first distance from the source of the first precursor material and the second distance from the source of the second precursor material occur approximately simultaneously;
  transforming the first device material into the second device material further comprises:
    positioning the carrier substrate a third distance from the source of the first precursor material and a fourth distance from the source of the second precursor material;
  positioning the carrier substrate the first distance from the source of the first precursor material and the second distance from the source of the second precursor material comprises:
    exposing the carrier substrate to the first temperature; and
  positioning the carrier substrate the third distance from the source of the first precursor material and the fourth distance from the source of the second precursor material comprises:
    exposing the carrier substrate to the second temperature.

14. A method comprising:
providing a carrier substrate;
depositing a first precursor material over the carrier substrate;
depositing a second precursor material over the carrier substrate; and
while depositing the first precursor material over the carrier substrate, and while depositing the second precursor material over the carrier substrate:
  positioning the carrier substrate a first distance from a source of the first precursor material and a second distance from a source of the second precursor material;
  after positioning the carrier substrate the first distance from the source of the first precursor material and the second distance from the source of the second precursor material, positioning the carrier substrate a third distance from the the third temperature is greater than the first temperature and less than the second temperature; and
  the fourth temperature comprises the first temperature.

15. The method of claim 14 wherein:
the third distance is less than the first distance and the fifth distance;
the fifth distance is less than the first distance and greater than the third distance;
the seventh distance comprises the first distance;
the fourth distance is less than the second distance and the sixth distance;
the sixth distance is less than the second distance and greater than the fourth distance; and
the eighth distance comprises the second distance.

16. The method of claim 14 wherein:
the first distance is greater than the second distance;
the third distance is greater than the fourth distance;
the fifth distance is greater than the sixth distance; and
the seventh distance is greater than the eighth distance.

17. The method of claim 14 wherein at least one of:
the first precursor material comprises cadmium selenide; or
the second precursor material comprises zinc sulfide.

18. The method of claim 14 wherein:
depositing the first precursor material over the carrier substrate and depositing the second precursor material over the carrier substrate comprise:
  forming a first device material over the carrier substrate;
  after forming the first device material over the carrier substrate, forming a second device material over the carrier substrate;
  after forming the second device material, forming a third device material over the carrier substrate; and
    source of the first precursor material and a fourth distance from the source of the second precursor material;
  after positioning the carrier substrate the third distance from the source of the first precursor material and the fourth distance from the source of the second precursor material, positioning the carrier substrate a fifth distance from the source of the first precursor material and a sixth distance from the source of the second precursor material; and
  after positioning the carrier substrate the fifth distance from the source of the first precursor material and the sixth distance from the source of the second precursor material, positioning the carrier substrate a seventh distance from the source of the first precursor material and an eighth distance from the source of the second precursor material;
wherein:
  positioning the carrier substrate the first distance from the source of the first precursor material and the second distance from the source of the second precursor material comprises:
    exposing the carrier substrate to a first temperature;
  positioning the carrier substrate the third distance from the source of the first precursor material and the fourth distance from the source of the second precursor material comprises:
    exposing the carrier substrate to a second temperature;

positioning the carrier substrate the fifth distance from the source of the first precursor material and the sixth distance from the source of the second precursor material comprises:

exposing the carrier substrate to a third temperature;

positioning the carrier substrate the seventh distance from the source of the first precursor material and the eighth distance from the source of the second precursor material comprises:

exposing the carrier substrate to a fourth temperature;

the second temperature is greater than the first temperature;

after forming the third device material, forming a fourth device material over the carrier substrate;

the first device material comprises a first quaternary alloy; and the first quaternary alloy comprises a first alloy composition.

19. The method of claim 18 wherein:

the second device material comprises a second quaternary alloy;

the second quaternary alloy comprises a second alloy composition;

the third device material comprises a third quaternary alloy;

the third quaternary alloy comprises a third alloy composition;

the fourth device material comprises a fourth quaternary alloy;

the fourth quaternary alloy comprises a fourth alloy composition;

the first quaternary alloy comprises the second quaternary alloy, the third quaternary alloy, and the fourth quaternary alloy;

the first alloy composition, the second alloy composition, and the third alloy composition each are different from each other; and the first alloy composition comprises the fourth alloy composition.

\* \* \* \* \*